United States Patent
Lee

(10) Patent No.: US 9,916,490 B2
(45) Date of Patent: Mar. 13, 2018

(54) FINGERPRINT SENSORS AND ELECTRONIC DEVICES HAVING THE SAME

(71) Applicant: Samsung Electronics Co., Ltd., Suwon-si (KR)

(72) Inventor: Choong-Hoon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 62 days.

(21) Appl. No.: 15/067,506

(22) Filed: Mar. 11, 2016

(65) Prior Publication Data

US 2017/0046551 A1 Feb. 16, 2017

(30) Foreign Application Priority Data

Aug. 12, 2015 (KR) ......................... 10-2015-0113580

(51) Int. Cl.
*G06K 9/00* (2006.01)
*H03M 1/10* (2006.01)
*H03M 1/12* (2006.01)

(52) U.S. Cl.
CPC ........ *G06K 9/0002* (2013.01); *H03M 1/1023* (2013.01); *H03M 1/124* (2013.01)

(58) Field of Classification Search
CPC ............. G06K 9/0002; G06K 9/00013; G06K 9/00053; H03M 1/124; H03M 1/1023; H04N 5/378; H04N 5/374; H04N 3/1512; H04N 5/3658
USPC ....................................................... 382/124
See application file for complete search history.

(56) References Cited

U.S. PATENT DOCUMENTS

| 5,877,715 A * | 3/1999 | Gowda ............... H03M 1/1023 341/118 |
| 6,411,727 B1 | 6/2002 | Harkin |
| 7,864,992 B2 | 1/2011 | Riedijk et al. |
| RE42,918 E * | 11/2011 | Fossum ............... G11C 19/282 348/294 |
| 8,131,027 B2 | 3/2012 | Mizushima et al. |

(Continued)

FOREIGN PATENT DOCUMENTS

| JP | 2003078365 | 3/2003 |
| JP | 2008090461 | 4/2008 |
| KR | 100672619 | 1/2007 |

*Primary Examiner* — Kanjibhai Patel
(74) *Attorney, Agent, or Firm* — Onello & Mello, LLP

(57) ABSTRACT

A fingerprint sensor includes a pixel array, an offset cancellation circuit, a correlated double sampling and integration circuit, a sample and hold circuit, and an analog-to-digital converter. The pixel array includes unit pixels arranged in rows and columns, each of which generates an analog signal by detecting a fingerprint of a user. The offset cancellation circuit receives the analog signal from the unit pixels through a plurality of column lines, and outputs one of the analog signal and an offset cancellation signal as an integration signal based on an offset control signal. The correlated double sampling and integration circuit accumulatively performs a correlated double sampling operation and an integration operation on the integration signal to generate an accumulation signal. The sample and hold circuit samples the accumulation signal based on a hold signal to generate a sampling signal. The analog-to-digital converter converts the sampling signal to a digital signal.

20 Claims, 14 Drawing Sheets

(56) References Cited

U.S. PATENT DOCUMENTS

| | | | |
|---|---|---|---|
| 8,218,049 B2 * | 7/2012 | Sakakibara | H04N 5/363 348/300 |
| 8,787,632 B2 | 7/2014 | Dean et al. | |
| 8,888,004 B2 * | 11/2014 | Setlak | G06K 9/0002 235/439 |
| 9,590,592 B2 * | 3/2017 | Johal | H03H 19/004 |
| 2005/0018884 A1 | 1/2005 | Lee et al. | |
| 2012/0092026 A1 | 4/2012 | Liautaud et al. | |
| 2013/0287274 A1 * | 10/2013 | Shi | G06F 3/044 382/124 |
| 2014/0267659 A1 | 9/2014 | Lyon et al. | |

* cited by examiner

FINGERPRINT SENSORS AND ELECTRONIC DEVICES HAVING THE SAME

CROSS-REFERENCE TO RELATED APPLICATION(S)

This U.S. non-provisional application claims priority under 35 USC § 119 to Korean Patent Application No. 10-2015-0113580, filed on Aug. 12, 2015 in the Korean Intellectual Property Office (KIPO), the contents of which are herein incorporated by reference in their entirety.

BACKGROUND

1. Technical Field

Some example embodiments may relate to a fingerprint sensor. More particularly, some example embodiments may relate to a fingerprint sensor having an increased sensing performance.

2. Description of the Related Art

Generally, a fingerprint sensor obtains a fingerprint image of a finger by generating an analog signal having a magnitude proportional to a capacitance between a finger and a sensing electrode included in a pixel, and comparing magnitudes of the analog signals generated by the pixels.

A difference between a capacitance between the finger and a sensing electrode included in a pixel on which a ridge of a fingerprint is located and a capacitance between the finger and a sensing electrode included in a pixel on which a valley of the fingerprint is located is very small. Therefore, a difference between a magnitude of the analog signal generated by the pixel on which a ridge of the fingerprint is located and a magnitude of the analog signal generated by the pixel on which a valley of the fingerprint is located also may be very small.

For this reason, a fingerprint sensor generally performs an integration operation on the analog signal generated by the pixels accumulatively, and obtains the fingerprint image of the finger based on the integrated signal.

As the number of times the integration operation performed on the analog signal increases, a sensing performance may increase. However, as the number of times the integration operation is performed on the analog signal increases, a magnitude of the integrated signal may also increase, thus, a size of an integration circuit may be increased.

SUMMARY

Some example embodiments provide a fingerprint sensor having an increased sensing performance without increasing a size of an integration circuit.

Some example embodiments provide an electronic device including the fingerprint sensor.

According to an aspect of the present inventive concepts, a fingerprint sensor includes a pixel array, an offset cancellation circuit, a correlated double sampling and integration circuit, a sample and hold circuit, an analog-to-digital converter, and a controller. The pixel array includes a plurality of unit pixels arranged in rows and columns. Each of the plurality of unit pixels generates an analog signal by detecting a fingerprint of a user. The offset cancellation circuit receives the analog signal from the plurality of unit pixels through a plurality of column lines, and outputs one of the analog signal and an offset cancellation signal as an integration signal based on an offset control signal. The correlated double sampling and integration circuit accumulatively performs a correlated double sampling operation and an integration operation on the integration signal to generate an accumulation signal. The sample and hold circuit samples the accumulation signal based on a hold signal to generate a sampling signal. The analog-to-digital converter performs an analog-to-digital conversion operation on the sampling signal to generate a digital signal. The controller generates the offset control signal and the hold signal.

In some example embodiments, each of the plurality of unit pixels may alternately output a first analog signal corresponding to a reset element, and a second analog signal corresponding to the fingerprint of the user a plurality of times through a corresponding column line among the plurality of column lines.

In some example embodiments, when the offset control signal is deactivated, the offset cancellation circuit may output the first analog signal and the second analog signal received through each of the plurality of column lines as the integration signal. When the offset control signal is activated and the first analog signal is provided through each of the plurality of column lines, the offset cancellation circuit may output a first offset cancellation signal as the integration signal. When the offset control signal is activated and the second analog signal is provided through each of the plurality of column lines, the offsets cancellation circuit may output a second offset cancellation signal as the integration signal.

In some example embodiments, the first analog signal may have a first voltage level, the second analog signal may have a second voltage level lower than the first voltage level, the first offset cancellation signal may have a third voltage level lower than the second voltage level, and the second offset cancellation signal may have a fourth voltage level higher than the first voltage level.

In some example embodiments, the controller may activate the offset control signal periodically.

In some example embodiments, the controller may activate the offset control signal when a magnitude of the accumulation signal generated by the correlated double sampling and integration circuit is greater than a threshold value.

In some example embodiments, the offset cancellation circuit may include a switching circuit and a plurality of multiplexers. The switching circuit may receive a first phase signal and a second phase signal from the controller, output a first offset cancellation signal when the first phase signal is activated, and output a second offset cancellation signal when the second phase signal is activated. The plurality of multiplexers may correspond to the plurality of column lines, respectively. Each of the plurality of multiplexers may output the first analog signal and the second analog signal received through the corresponding column line as the integration signal when the offset control signal is deactivated, and output an output signal of the switching circuit as the integration signal when the offset control signal is activated.

In some example embodiments, the correlated double sampling and integration circuit may include a plurality of integrators corresponding to the plurality of multiplexers, respectively. Each of the plurality of integrators may include a storage capacitor coupled between a first node and a corresponding multiplexer among the plurality of multiplexers, a first integration switch configured to turn on in response to a first switch signal to provide a reference voltage to the first node, an amplifier including a negative input electrode, a positive input electrode receiving the reference voltage, and an output electrode, a second integration switch coupled between the first node and the negative input electrode of the amplifier, and configured to turn on in response to a second switch signal, an accumulation capacitor coupled between the negative input electrode of the amplifier and the output electrode of the amplifier, and a reset switch coupled between the negative input electrode of the amplifier and the output electrode of the amplifier, and configured to turn on in response to a reset signal.

In some example embodiments, the first switch signal and the second switch signal may be activated alternately without an overlap period.

In some example embodiments, each of the plurality of integrators may further include an offset adjustment switch coupled between a second node and the corresponding multiplexer, and configured to turn on in response to the offset control signal, and an offset adjustment capacitor coupled between the second node and the first node.

In some example embodiments, a capacitance of the offset adjustment capacitor may be varied based on an offset adjustment signal provided by the controller.

In some example embodiments, the correlated double sampling and integration circuit may include a plurality of integrators corresponding to the plurality of multiplexers, respectively. Each of the plurality of integrators may include a first storage capacitor coupled between a first node and a corresponding multiplexer among the plurality of multiplexers, a second storage capacitor coupled between a second node and the corresponding multiplexer, an amplifier including a first input electrode, a second input electrode, a first output electrode, and a second output electrode, and operating based on a reference voltage, a first integration switch configured to turn on in response to a first switch signal to provide the reference voltage to the first node, a second integration switch coupled between the first node and the first input electrode of the amplifier, and configured to turn on in response to a second switch signal, a third integration switch configured to turn on in response to the second switch signal to provide the reference voltage to the second node, a fourth integration switch coupled between the second node and the second input electrode of the amplifier, and configured to turn on in response to the first switch signal, a first accumulation capacitor coupled between the first input electrode of the amplifier and the first output electrode of the amplifier, a first reset switch coupled between the first input electrode of the amplifier and the first output electrode of the amplifier, and configured to turn on in response to a reset signal, a second accumulation capacitor coupled between the second input electrode of the amplifier and the second output electrode of the amplifier, and a second reset switch coupled between the second input electrode of the amplifier and the second output electrode of the amplifier, and configured to turn on in response to the reset signal.

In some example embodiments, each of the plurality of integrators may further include a first offset adjustment switch coupled between a third node and the corresponding multiplexer, and configured to turn on in response to the offset control signal, a first offset adjustment capacitor coupled between the third node and the first node, a second offset adjustment switch coupled between a fourth node and the corresponding multiplexer, and configured to turn on in response to the offset control signal, and a second offset adjustment capacitor coupled between the fourth node and the second node.

According to another aspect of the present inventive concepts, an electronic device includes a fingerprint sensor and an application processor. The fingerprint sensor generates an analog signal representing a fingerprint pattern of a user as an integration signal during a plurality of first time periods, generates an offset cancellation signal having a first voltage level as the integration signal during at least one second time period between the plurality of first time periods accumulatively performs a correlated double sampling operation and an integration operation on the integration signal during the plurality of first time periods and the at least one second time period to generate an accumulation signal, and generates a digital signal based on the accumulation signal. The application processor authenticates the user based on the digital signal.

In some example embodiments, the fingerprint sensor may include a pixel array, an offset cancellation circuit, a correlated double sampling and integration circuit, a sample and hold circuit, an analog-to-digital converter, and a controller. The pixel array may include a plurality of unit pixels arranged in rows and columns. Each of the plurality of unit pixels may generate the analog signal by detecting a fingerprint of the user. The offset cancellation circuit may receive the analog signal from the plurality of unit pixels through a plurality of column lines, and output one of the analog signal and the offset cancellation signal as the integration signal based on an offset control signal. The correlated double sampling and integration circuit may accumulatively perforin a correlated double sampling operation and an integration operation on the integration signal to generate the accumulation signal. The sample and hold circuit may sample the accumulation signal based on a hold signal to generate a sampling signal. The analog-to-digital converter may perform an analog-to-digital conversion operation on the sampling signal to generate the digital signal. The controller may generate the offset control signal and the hold signal.

According to another aspect of the present inventive concepts, a fingerprint sensor, includes a pixel array including a plurality of unit pixels arranged in rows and columns. Each of the plurality of unit pixels is configured to generate an analog signal by detecting a fingerprint of a user. The fingerprint sensor further includes an offset cancellation circuit coupled to the pixel array and configured to receive the analog signal from the plurality of unit pixels of a selected row of the pixel array through a plurality of column lines. The offset cancellation circuit is configured to output one of the analog signal and an offset cancellation signal as an integration signal based on an offset control signal. The fingerprint sensor further includes a correlated double sampling and integration circuit coupled to the offset cancellation circuit and configured to accumulatively perform a correlated double sampling operation and an integration operation on the integration signal to generate an accumulation signal. The correlated double sampling and integration circuit is configured to eliminate an offset element of the accumulation signal when the offset cancellation signal is output as the integration signal.

In some embodiments, the finger print sensor further includes a sample and hold circuit configured to sample the accumulation signal based on a hold signal to generate a sampling signal, an analog-to-digital converter configured to perform an analog-to-digital conversion operation on the sampling signal to generate a digital signal, and a controller configured to generate the offset control signal and the hold signal.

In some embodiments, each of the plurality of unit pixels alternately outputs a first analog signal corresponding to a reset element, and a second analog signal corresponding to the fingerprint of the user a plurality of times through a corresponding column line among the plurality of column lines.

In some embodiments, when the offset control signal is deactivated, the offset cancellation circuit outputs the first analog signal and the second analog signal received through each of the plurality of column lines as the integration signal. When the offset control signal is activated and the first analog signal is provided through each of the plurality of column lines, the offset cancellation circuit outputs a first offset cancellation signal as the integration signal. When the offset control signal is activated and the second analog signal is provided through each of the plurality of column lines, the offset cancellation circuit outputs a second offset cancellation signal as the integration signal.

In some embodiments, the controller activates the offset control signal periodically.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENTS

Figure 1:
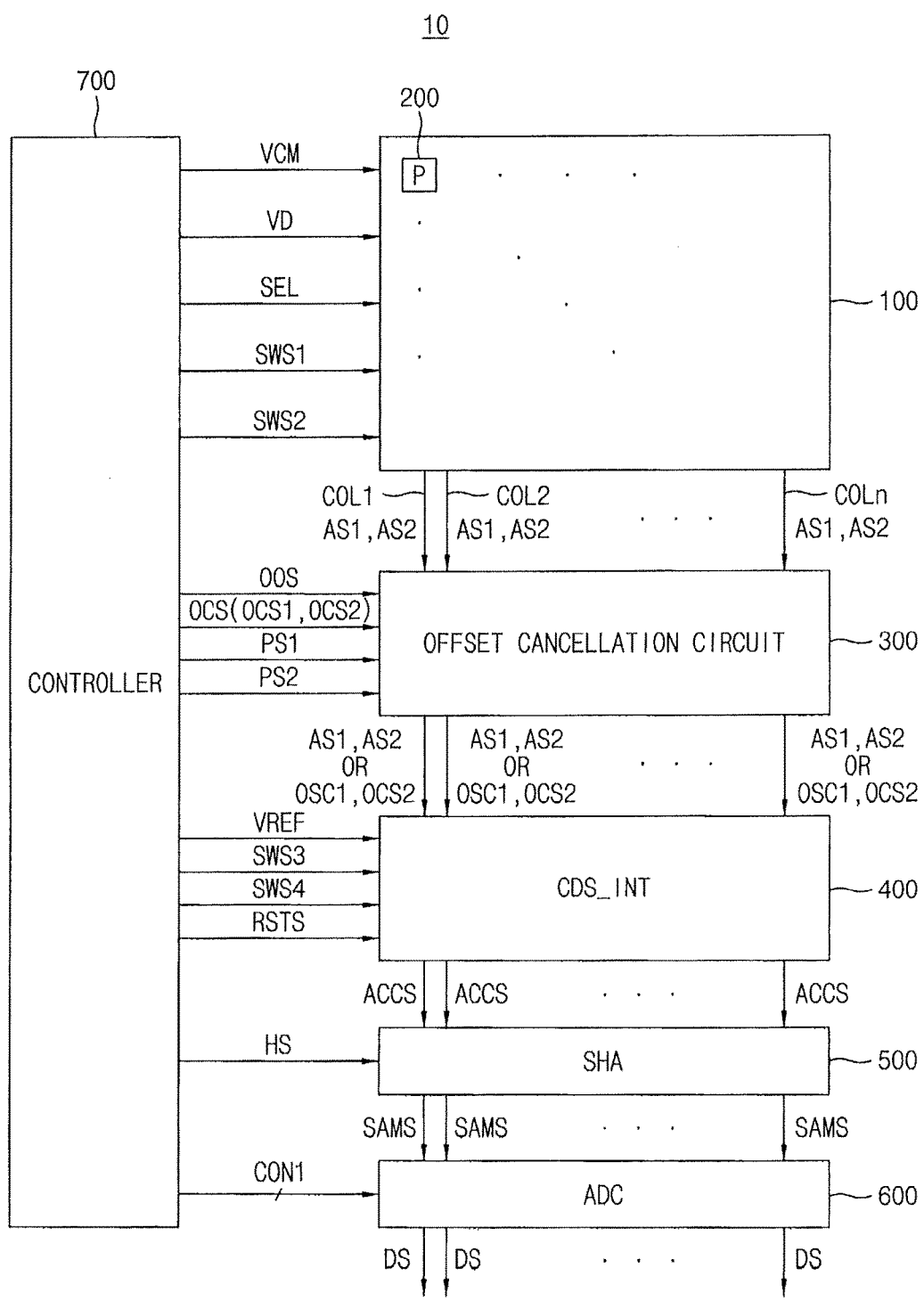
FIG. 1 is a block diagram illustrating a fingerprint sensor according to some example embodiments.

Various example embodiments will be described more fully hereinafter with reference to the accompanying drawings, in which some example embodiments are shown. The present inventive concepts may, however, be embodied in many different forms and should not be construed as limited to the embodiments set forth herein.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another, component, region, layer and/or section. Thus, a first element, component, region, layer and/or section could be termed a second element, component, region, layer and/or section, and, similarly, a second element, component, region, layer and/or section could be termed a first element, component, region, layer and/or section, without departing from the scope of the present inventive concepts.

It will be understood that when an element is referred to as being "on," "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram illustrating a fingerprint sensor 10 according to some example embodiments.

Referring to FIG. 1, the fingerprint sensor 10 includes a pixel array 100, an offset cancellation circuit 300, a correlated double sampling and integration circuit CDS_INT 400, a sample and hold circuit SHA 500, an analog-to-digital converter ADC 600, and a controller 700.

The pixel array 100 may include a plurality of unit pixels 200 (for example, P) arranged in rows and columns.

The controller 700 may provide a common voltage VCM and a detection voltage VD to each of the plurality of unit pixels 200 in the pixel array 100. In addition, the controller 700 may control an operation of the pixel array 100 in, for example, a selected row of the pixel array 100 using a selection control signal SEL, a first switch signal SWS1, and a second switch signal SWS2.

When a finger contacts the pixel array 100, that is, when a finger presses on the pixel array 100, each of the plurality of unit pixels 200 included in the pixel array 100 may generate an analog signal by detecting a fingerprint pattern of the finger on the pixel array 100. In some example embodiments, each of the plurality of unit pixels 200 may alternately output a first analog signal AS1, which corresponds to a reset element, and a second analog signal AS2, which corresponds to a fingerprint of the finger on the pixel array 100 to offset cancellation circuit 200 through a plurality of column lines COL1, COL2, . . . , COLn in a selected row of the pixel array 100, respectively. n represents a positive integer.

Figure 2:
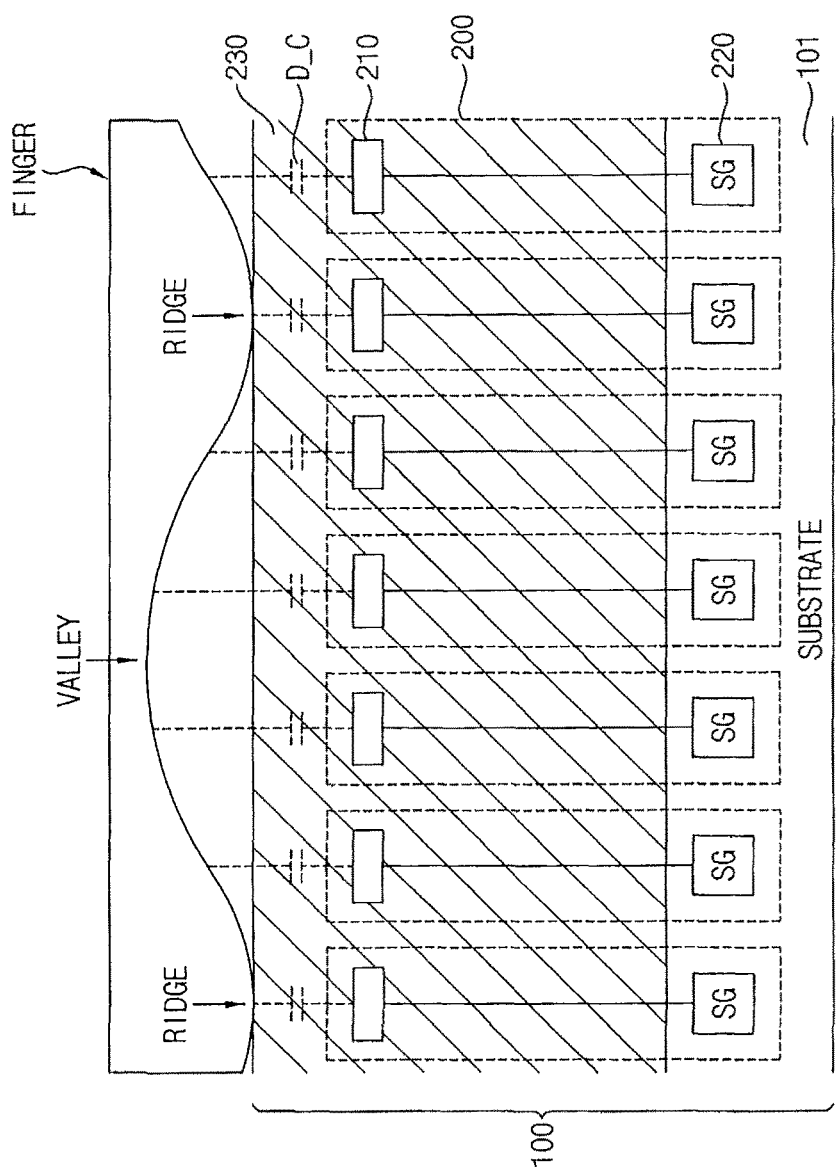
FIG. 2 is a cross-sectional view illustrating a pixel array included in the fingerprint sensor of FIG. 1 according to some example embodiments.

FIG. 2 is a cross-sectional view illustrating a pixel array 100 included in the fingerprint sensor 10 of FIG. 1 according to some example embodiments.

Referring to FIG. 2, each of the plurality of unit pixels 200 included in the pixel array 100 may include a sensing electrode 210, which is formed above a semiconductor substrate 101, and a signal generation circuit SG 220, which is formed on the semiconductor substrate 101. The sensing electrode 210 included in each of the plurality of unit pixels 200 may be electrically connected to the corresponding signal generation circuit 220 included in each of the plurality of unit pixels 200.

In some example embodiments, the sensing electrode 210 may be, for example, a metal plate including, for example, a metal material.

The pixel array 100 may further include an insulation layer 230. The insulation layer 230 is formed above the semiconductor substrate 101 and covers the sensing electrode 210 of each of the plurality of unit pixels 200. In some example embodiments, at least a portion of the insulation layer 230 formed above the sensing electrode 210 may include glass.

FIG. 2 represents a state when a finger FINGER is on the insulation layer 230 included in the pixel array 100.

When the finger contacts the pixel array 100, the finger may operate as an electrode. Therefore, the sensing electrode 210 included in each of the plurality of unit pixels 200 may form a detection capacitor D_C together with the finger FINGER. That is, the finger FINGER and the sensing electrode 210 included in each of the plurality of unit pixels 200 are two electrodes of a capacitor, for example, the detection capacitor D_C.

Generally, a fingerprint of a person has an intrinsic pattern formed by a ridge and a valley.

Therefore, as illustrated in FIG. 2, a distance between the finger and the sensing electrode 210 included in the unit pixel 200 on which a ridge of the fingerprint is located may be smaller than a distance between the finger and the sensing electrode 210 included in the unit pixel 200 on which a valley of the fingerprint is located. In addition, a distance at a bottom most portion of the valley of the finger and the sensing electrode 210 included in the unit pixel 200 on which a valley of the fingerprint is located may be greater than other portions of the valley and the sensing electrode 210 included in the unit pixel 200 on which a valley of the fingerprint is located.

Since a capacitance of a capacitor is inversely proportional to a distance between two electrodes of the capacitor, a capacitance of the detection capacitor D_C formed by the finger and the sensing electrode 210 included in the unit pixel 200 on which a ridge of the fingerprint is located may be greater than a capacitance of the detection capacitor D_C formed by the finger and the sensing electrode 210 included in the unit pixel 200 on which a valley of the fingerprint is located.

The signal generation circuit 220 included in each of the plurality of unit pixels 200 may alternately generate the first analog signal AS1 corresponding to the reset element and the second analog signal AS2 having a magnitude proportional to a capacitance of the detection capacitor D_C formed by the corresponding sensing electrode 210 and the finger.

Figure 3:
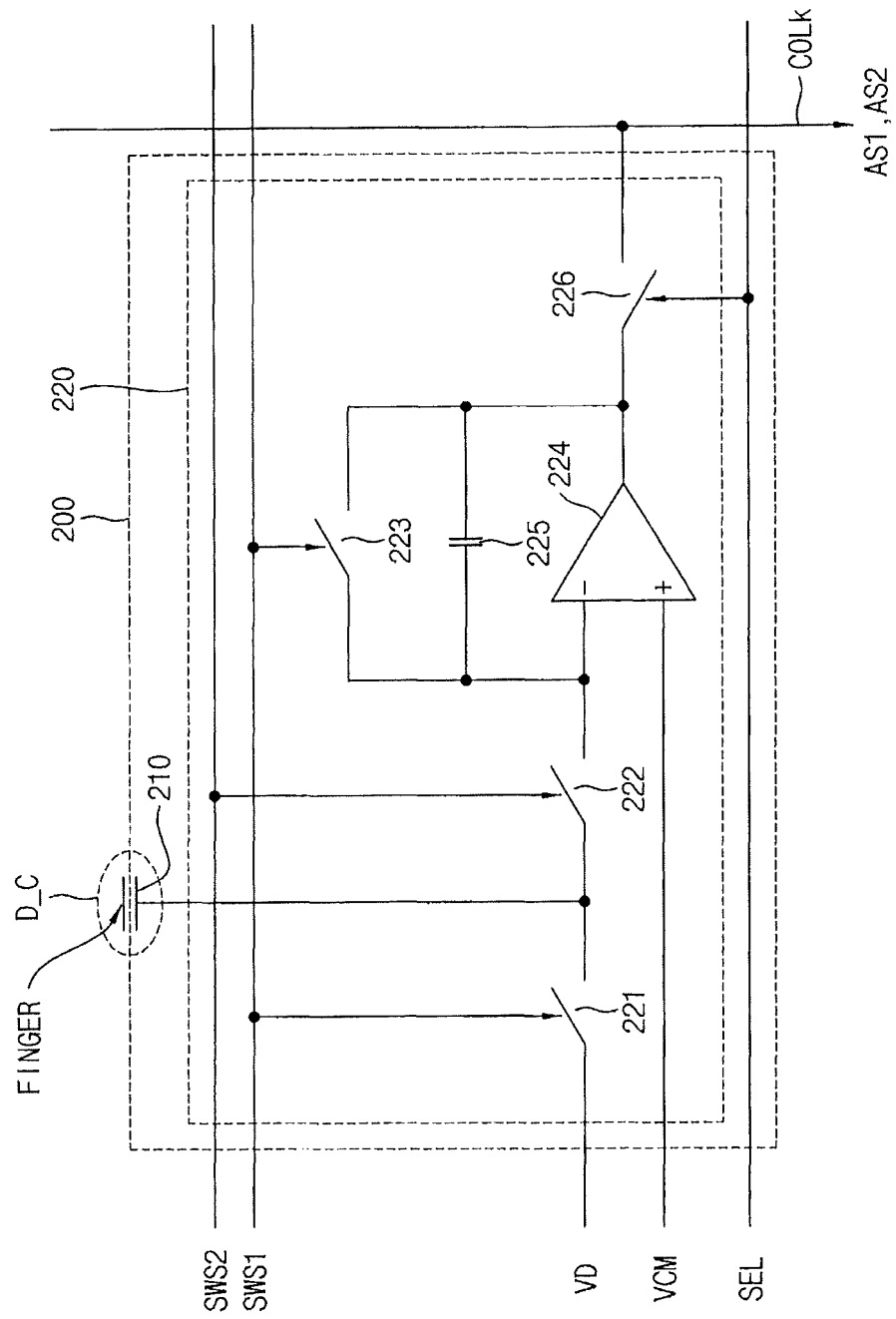
FIG. 3 is a circuit diagram illustrating a unit pixel included in the fingerprint sensor of FIG. 1 according to some example embodiments.

FIG. 3 is a circuit diagram illustrating a unit pixel 200 included in the fingerprint sensor 10 of FIG. 1 according to some example embodiments.

Each of the plurality of unit pixels 200 included in the pixel array 100 of FIG. 1 may be a unit pixel 200 of FIG. 3.

Referring to FIG. 3, the unit pixel 200 may include the sensing electrode 210 and the signal generation circuit 220.

As illustrated in FIG. 2, the sensing electrode 210 included in the unit pixel 200 and the finger contacted on the pixel array 100 may form the detection capacitor D_C.

The signal generation circuit 220 may include a first switch 221, a second switch 222, a third switch 223, an amplifier 224, a feedback capacitor 225, and a selection switch 226.

The amplifier 224 may include a negative input electrode (−), a positive input electrode (+), and an output electrode. The positive input electrode (+) of the amplifier 224 may receive the common voltage VCM provided by the controller 700.

The first switch 221 may be coupled between the controller 700 and the sensing electrode 210. The first switch 221 may be turned on in response to the first switch signal SWS1 provided by the controller 700. When the first switch 221 is turned on, the first switch 221 may provide the detection voltage VD provided by the controller 700 to the sensing electrode 210.

The second switch 222 may be coupled between the negative input electrode (−) of the amplifier 224 and the sensing electrode 210. The second switch 222 may be turned on in response to the second switch signal SWS2 provided by the controller 700. When the second switch 222 is turned on, the sensing electrode 210 may be coupled to the negative input electrode (−) of the amplifier 224.

In some example embodiments, to increase an amplification gain of the amplifier 224, the detection voltage VD may be higher than a supply voltage with which the amplifier 224 operates. In addition, in some example embodiments, a voltage level of the first switch signal SWS1 and the second switch signal SWS2 in an activated state may be equal to or higher than the detection voltage VD.

The feedback capacitor 225 may be coupled between the negative input (−) electrode of the amplifier 224 and the output electrode of the amplifier 224.

The third switch 223 may be coupled between the negative input electrode (−) of the amplifier 224 and the output electrode of the amplifier 224. That is, the feedback capacitor 225 and the third switch 223 may be coupled in parallel between the negative input electrode of the amplifier 224 and the output electrode of the amplifier 224. The third switch 223 may be turned on in response to the first switch signal SWS1 provided by the controller 700. When the third switch 223 is turned on, the feedback capacitor 225 may be reset.

The selection switch 226 may be coupled between the output electrode of the amplifier 224 and the corresponding column line COLk. k represents a positive integer equal to or smaller than n. The selection switch 226 may be turned on in response to the selection control signal SEL provided by the controller 700. When the selection switch 226 is turned on, the first analog signal AS1 and the second analog signal AS2 output through the output electrode of the amplifier 224 may be provided to the offset cancellation circuit 300 through the corresponding column line COLk. When the selection switch 226 is turned off, the signal generation circuit 220 may be disconnected from the corresponding column line COLk.

In some example embodiments, the first switch 221, the second switch 222, the third switch 223, and the selection switch 226 may include, for example, a MOS (Metal Oxide Semiconductor) transistor.

Hereinafter, an operation of the pixel array 100 will be described with reference to FIGS. 1 to 3.

When a finger contacts the pixel array 100, the controller 700 may determine one of the rows included in the pixel array 100 as a selected row.

The controller 700 may provide the selection control signal SEL in a deactivated state, the first switch signal SWS1 in the deactivated state, and the second switch signal SWS2 in the deactivated state to each of the unit pixels 200 included in the non-selected rows. Therefore, the selection switch 226, the first switch 221, the second switch 222, and the third switch 223 included in each of the unit pixels 200 included in the non-selected rows may be turned off. Therefore, referring to FIG. 3, the signal generation circuit 220 included in each of the unit pixels 200 included in the non-selected rows may be disconnected from the corresponding column line COLk.

The controller 700 may provide the selection control signal SEL in the activated state to each of selected unit pixels 200 included in the selected row.

Since the selection switch 226 included in the selected unit pixel 200 is turned on in response to the selection control signal SEL in the activated state, the output electrode of the amplifier 224 included in the selected unit pixel may be coupled to the corresponding column line COLk through the selection switch 226. That is, only the unit pixels 200 in the selected row are coupled to the corresponding column line COLk through the selection switch 226.

Figure 4:
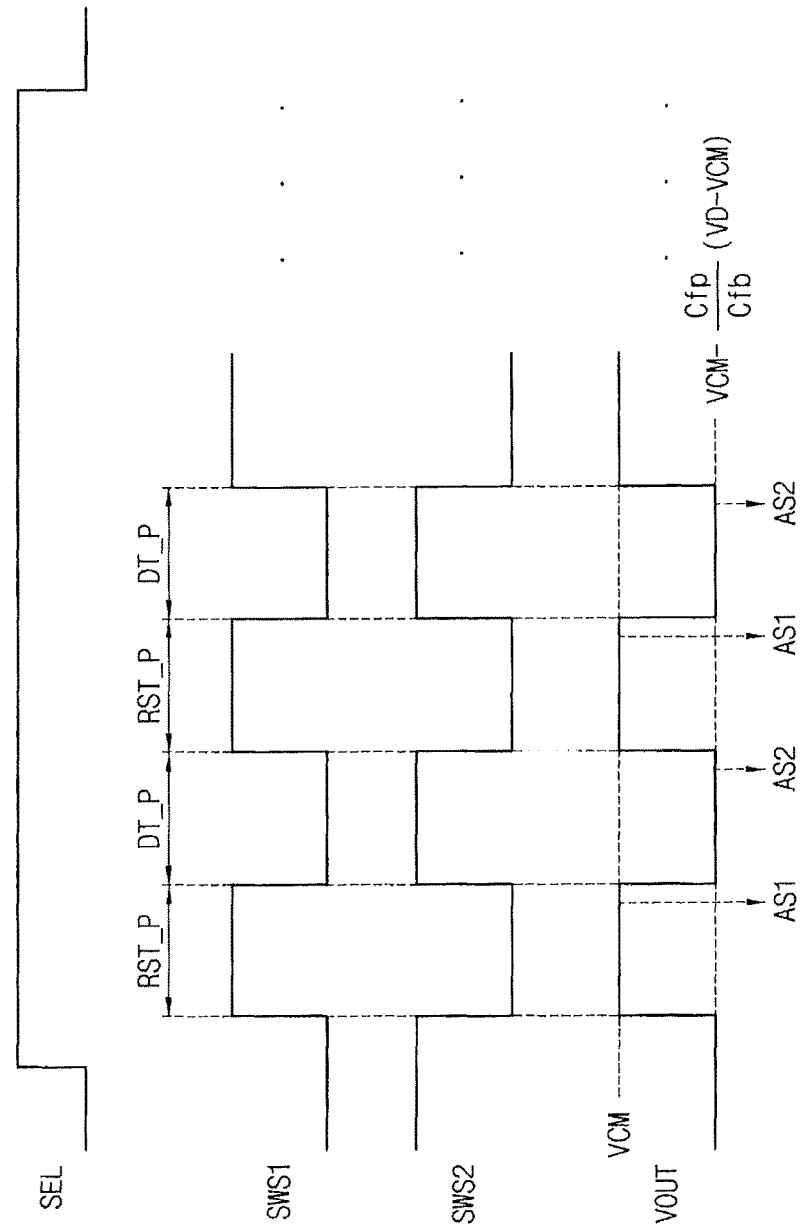
FIG. 4 is a timing diagram illustrating an operation of a selected unit pixel included in a selected row of the pixel array of FIG. 1.

FIG. 4 is a timing diagram illustrating an operation of a selected unit pixel 200 included in a selected row of the pixel array 100.

As illustrated in FIG. 4, a reset period RST_P and a detection period DTP may be alternated a plurality of times while one of the rows included in the pixel array 100 is determined as the selected row. That is, the reset period RST_P and the detection period DT_P may be alternated a plurality of times while the selection control signal SEL in the activated state is provided to the selected unit pixel included in the selected row.

Referring to FIG. 4, the controller 700 may provide the first switch signal SWS1 in the activated state and the second switch signal SWS2 in the deactivated state to each of the selected unit pixels 200 of the selected row during the reset period RST_P. Therefore, the first switch 221 and the third switch 223 included in the selected unit pixel 200 may be turned on during the reset period RST_P, and the second switch 222 included in the selected unit pixel 200 may be turned off during the reset period RST_P.

Since the first switch 221 is turned on, the detection voltage VD provided by the controller 700 may be applied to the sensing electrode 210 included in the selected unit pixel 200. Therefore, the detection capacitor D_C formed by the sensing electrode 210 included in the selected unit pixel and the finger may be charged by the detection voltage VD.

Since the third switch 223 is turned on, the feedback capacitor 225 may be reset. In addition, since the common voltage VCM is applied to the positive input electrode (+) of the amplifier 224, a voltage of the negative input electrode (−) of the amplifier 224 may be substantially the same as the common voltage VCM. Therefore, a voltage VOUT of the output electrode of the amplifier 224 may correspond to the common voltage VCM.

Therefore, the selected unit pixel may output the common voltage VCM through the corresponding column line COLk as the first analog signal AS1 during the reset period RST_P.

After that, during the detection period DT_P, the controller 700 may provide the first switch signal SWS1 in the deactivated state and the second switch signal SWS2 in the activated state to the selected unit pixels 200 of the selected row. Therefore, the first switch 221 and the third switch 223 included in the selected unit pixels 200 may be turned off during the detection period DT_P, and the second switch 222 included in the selected unit pixels 200 may be turned on during the detection period DT_P.

Therefore, charges stored in the detection capacitor D_C formed by the sensing electrode 210 included in the selected unit pixel and the finger on the pixel array may be dispersed to the feedback capacitor 225.

Therefore, the voltage VOUT, as illustrated in FIG. 4, of the output electrode of the amplifier 224 in the detection period DT_P may be represented as [Equation 1].

$$VOUT=VCM-(Cfp/Cfb)*(VD-VCM) \quad \text{[Equation 1]}$$

Cfp represents a capacitance of the detection capacitor D_C formed by the sensing electrode 210 included in the selected unit pixel and the finger, and Cfb represents a capacitance of the feedback capacitor 225.

Therefore, during the detection period DT_P the selected unit pixel 200 may output the voltage VOUT of the output electrode of the amplifier 224 represented in the [Equation 1] through the column line COLk as the second analog signal AS2.

As represented in the [Equation 1], the second analog signal AS2 output from the selected unit pixel 200 during the detection period DT_P may have a magnitude proportional to the capacitance Cfp of the detection capacitor D_C formed by the sensing electrode 210 included in the selected unit pixel and the finger.

As illustrated in FIG. 4, since the controller 700 alternates the reset period RST_P and the detection period DTP a plurality of times while one of the rows included in the pixel array 100 is determined as the selected row, the selected unit pixel may alternately output the first analog signal AS1 and the second analog signal AS2 a plurality of times for the same selected unit pixel 200.

After that, the controller 700 may consecutively select each of the rows included in the pixel array 100 by moving in a unit of a row to determine the selected row, and, repeatedly, perform the operation described above with reference to FIG. 4 on the selected unit pixels of the selected row. Thereby, the pixel array 100 may output the first analog signal AS1 and the second analog signal AS2 of the selected pixels row by row. The controller 700 may consecutively select each of the rows by selecting a first row and then selecting the next adjacent row until all of the rows have been selected.

As described above, a capacitance of the detection capacitor D_C formed by the finger and the sensing electrode 210 included in the unit pixel 200 on which a ridge of the fingerprint is located is greater than a capacitance of the detection capacitor D_C formed by the finger and the sensing electrode 210 included in the unit pixel 200 on which a valley of the fingerprint is located. Therefore, a magnitude of the second analog signal AS2 generated by the unit pixel 200 on which a ridge of the fingerprint is located may be greater than a magnitude of the second analog signal AS2 generated by the unit pixel 200 on which a valley of the fingerprint is located. As a result, the fingerprint sensor 10 may determine the fingerprint pattern of the finger based on a difference between the first analog signal AS1 and the second analog signal AS2 generated by each of the plurality of unit pixels 200.

However, generally, a difference between the capacitance of the detection capacitor D_C formed by the finger and the sensing electrode 210 included in the unit pixel 200 on which a ridge of the fingerprint is located and the capacitance of the detection capacitor D_C formed by the finger and the sensing electrode 210 included in the unit pixel 200 on which a valley of the fingerprint is located is small. Therefore, a difference between the magnitude of the second analog signal AS2 generated by the unit pixel 200 on which a ridge of the fingerprint is located and the magnitude of the second analog signal AS2 generated by the unit pixel 200 on which a valley of the fingerprint is located also may be small.

Therefore, the fingerprint sensor 10 may generate an accumulation signal ACCS by accumulatively performing a correlated double sampling operation and an integration operation on the first analog signal AS1 and the second analog signal AS2. The first analog signal AS1 and the second analog signal AS2 are generated by each of the plurality of unit pixels 200 a plurality of times, using the correlated double sampling and integration circuit 400. The finger print sensor 10 may determine the fingerprint pattern of the finger based on a magnitude of the accumulation signal ACCS corresponding to each of the plurality of unit pixels 200.

Figure 5:
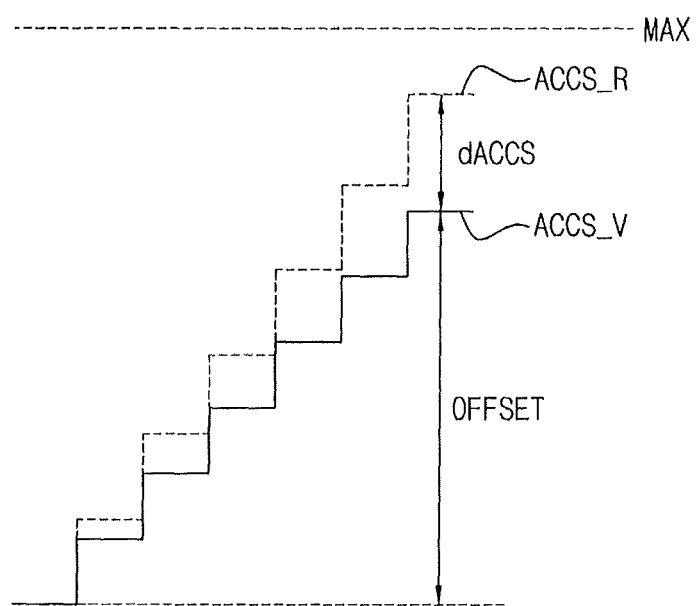
FIG. 5 is a diagram illustrating an operation of a correlated double sampling and integration circuit included in the fingerprint sensor of FIG. 1.

FIG. 5 is a diagram illustrating an operation of a correlated double sampling and integration circuit 400 included in the fingerprint sensor 10 of FIG. 1.

In FIG. 5, an accumulation signal ACCS_R represents the accumulation signal ACCS generated based on the first analog signal AS1 and the second analog signal AS2, which are generated by the unit pixel 200 on which a ridge of the fingerprint is located. An accumulation signal ACCS_V represents the accumulation signal ACCS generated based on the first analog signal AS1 and the second analog signal AS2, which are generated by the unit pixel 200 on which a valley of the fingerprint is located.

As illustrated in FIG. 5, as the number of times the correlated double sampling operation and the integration operation are performed by the correlated double sampling and integration circuit 400 on the first analog signal AS1 and the second analog signal AS2 increases, a difference dACCS between the accumulation signal ACCS_R, which corresponds to the unit pixel 200 on which a ridge of the fingerprint is located, and the accumulation signal ACCS_V, which corresponds to the unit pixel 200 on which a valley of the fingerprint is located, may increase. However, as the number of times the correlated double sampling operation and the integration operation are performed by the correlated double sampling and integration circuit 400 on the first analog signal AS1 and the second analog signal AS2 increases, an offset element OFFSET, which is irrelevant to the determination of the fingerprint pattern, may increase more rapidly than the difference dACCS between the accumulation signal ACCS_R and the accumulation signal ACCS_V.

Since a magnitude of the accumulation signal ACCS generated by the correlated double sampling and integration circuit 400 is smaller than a maximum value MAX that the correlated double sampling and integration circuit 400 is able to output, the number of times the conelated double sampling operation and the integration operation are performed by the correlated double sampling and integration circuit 400 on the first analog signal AS1 and the second analog signal AS2 may be limited by the offset element OFFSET. If the maximum value MAX that the correlated double sampling and integration circuit 400 is able to output is increased to increase the number of times the correlated double sampling operation and the integration operation may be performed by the correlated double sampling and integration circuit 400 on the first analog signal AS1 and the second analog signal AS2, a size of the correlated double sampling and integration circuit 400 may increase.

However, as described hereinafter, since the fingerprint sensor 10 according to some example embodiments includes the offset cancellation circuit 300 coupled between the pixel array 100 and the correlated double sampling and integration circuit 400, the fingerprint sensor 10 may effectively increase the number of times the correlated double sampling operation and the integration operation may be performed by the correlated double sampling and integration circuit 400 on the first analog signal AS1 and the second analog signal AS2 without increasing the size of the correlated double sampling and integration circuit 400.

Referring again to FIG. 1, the offset cancellation circuit 300 may receive the first and second analog signals AS1 and AS2 from the plurality of unit pixels 200 through the plurality of column lines COL1, COL2, . . . , COLn. The offset cancellation circuit 200 may receive an offset control signal OOS and offset cancellation signals OSC, for example, first and second offset cancellation signals OCS1 and OCS2, from the controller 700. The offset cancellation circuit 300 may output one of the first and second analog signals AS1 and AS2 and the first and second offset cancellation signals OCS1 and OCS2 as an integration signal based on the offset control signal OOS from the controller 700. That is, the offset cancellation circuit 300 outputs either the first and second analog signals AS1 and AS2 or the first and second cancellation signals OCS1 and OCS2 based on the offset control signal OOS.

In some example embodiments, when the offset control signal OOS is deactivated, the offset cancellation circuit 300 may output the first analog signal AS1 and the second analog signal AS2, which are received alternately through each of the plurality of column lines COL1, COL2, . . . , COLn, as the integration signal. In some example embodiments, when the offset control signal OOS is activated and the first analog signal AS1 is provided through each of the plurality of column lines COL1, COL2, . . . , COLn, the offset cancellation circuit 300 may output a first offset cancellation signal OCS1 as the integration signal. In some example embodiments, when the offset control signal OOS is activated and the second analog signal AS2 is provided through each of the plurality of column lines COL1, COL2, . . . , COLn, the offset cancellation circuit 300 may output a second offset cancellation signal OCS2 as the integration signal.

In some example embodiments, the first offset cancellation signal OCS1 and the second offset cancellation signal OCS2 may have predetermined voltage levels.

As described above with reference to FIG. 4, the first analog signal AS1 may have a first voltage level, and the second analog signal AS2 may have a second voltage level lower than the first voltage level. In this example embodiment, the first offset cancellation signal OCS1 may have a third voltage level lower than the second voltage level, and the second offset cancellation signal OCS2 may have a fourth voltage level higher than the first voltage level. That is, the fourth voltage level of the second offset cancellation signal OCS2 may be higher than the first, second and third voltage levels and the third voltage level of the first offset cancellations signal OCS1 may be lower than the first, second and fourth voltage levels.

Figure 6:
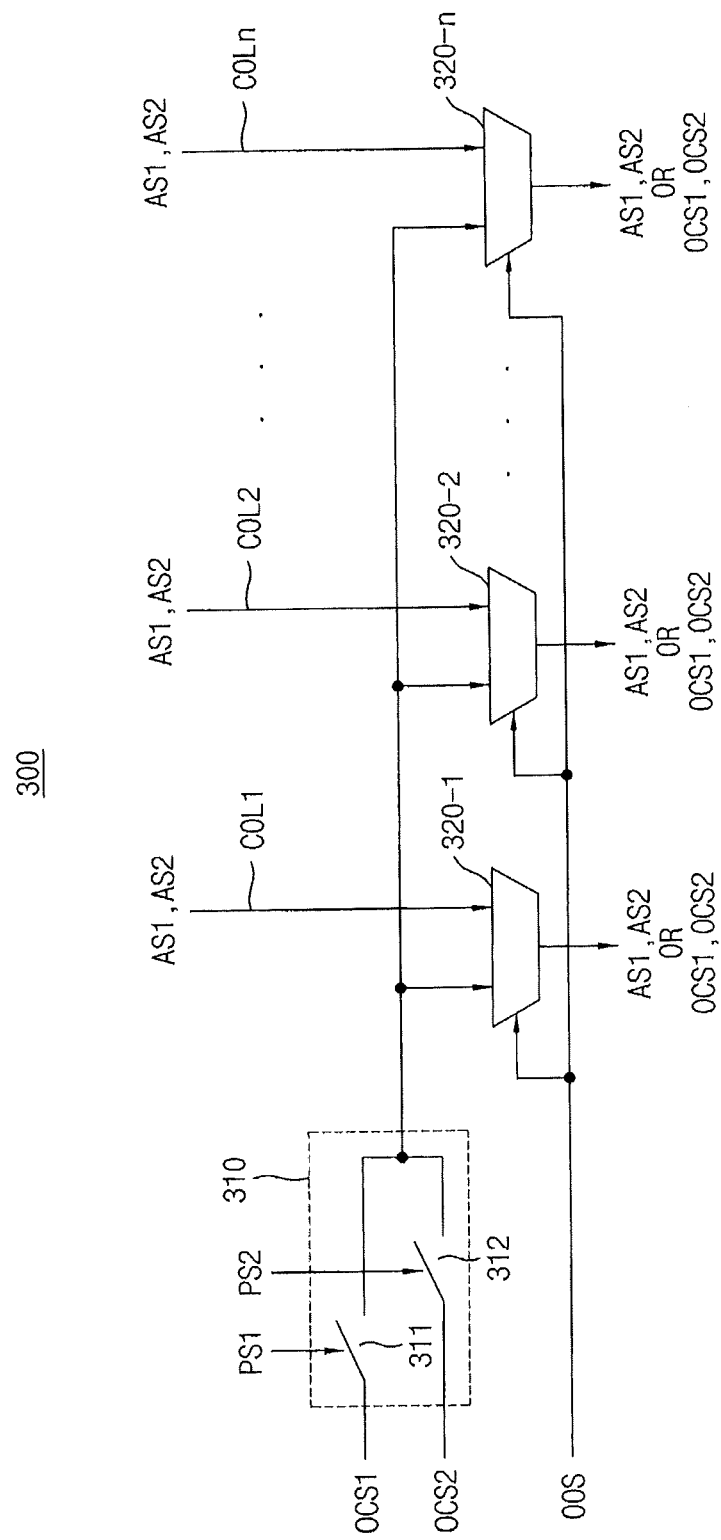
FIG. 6 is a circuit diagram illustrating an offset cancellation circuit included in the fingerprint sensor of FIG. 1 according to some example embodiments.
Figure 7:
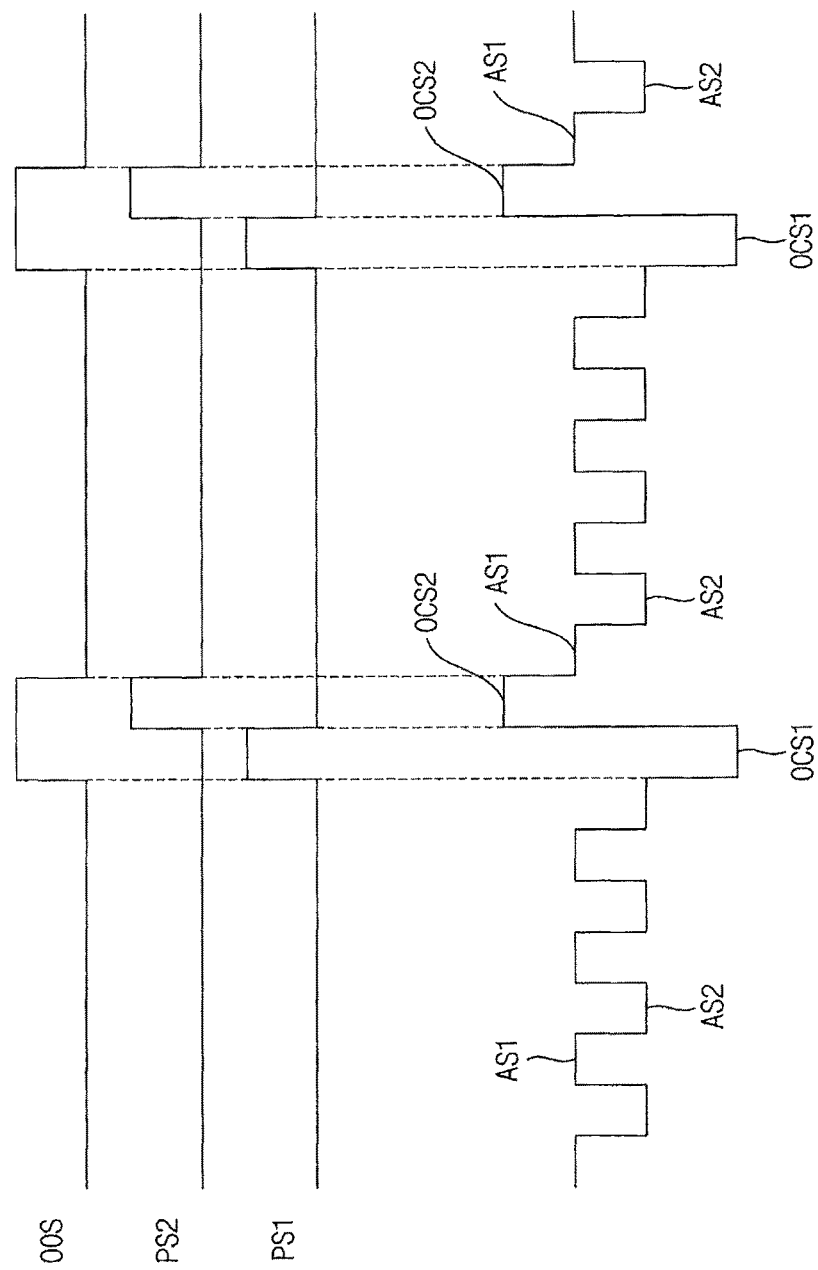
FIG. 7 is a timing diagram illustrating an operation of the offset cancellation circuit of FIG. 6.

FIG. 6 is a circuit diagram illustrating an offset cancellation circuit 300 included in the fingerprint sensor 10 of FIG. 1 according to some example embodiments, and FIG. 7 is a timing diagram illustrating an operation of the offset cancellation circuit 300 of FIG. 6.

Referring to FIG. 6, the offset cancellation circuit 300 may include a switching circuit 310 and a plurality of multiplexers 320-1, 320-2, . . . , 320-n.

The switching circuit 310 may receive a first phase signal PS1, a second phase signal PS2, the first offset cancellation signal OCS1, and the second offset cancellation signal OCS2 from the controller 700. The switching circuit 310 may output the first offset cancellation signal OCS1 when the first phase signal PS1 is activated and the second phase signal PS2 is deactivated, and output the second offset cancellation signal OCS2 when the second phase signal PS2 is activated and the first phase signal PS1 is deactivated.

In some example embodiments, the switching circuit 310 may include a first offset switch 311 and a second offset switch 312. The first offset switch 311 may be turned on in response to the first phase signal PS1 being activated. When the first offset switch 311 is turned on, the first offset switch 311 may provide the first offset cancellation signal OCS1 to each of the plurality of multiplexers 320-1, 320-2, . . . , 320-n. The second offset switch 312 may be turned on in response to the second phase signal PS2 being activated. When the second offset switch 312 is turned on, the second offset switch 312 may provide the second offset cancellation signal OCS2 to each of the plurality of multiplexers 320-1, 320-2, . . . , 320-n.

The plurality of multiplexers 320-1, 320-2, . . . , 320-n may be coupled to the plurality of column lines COL1, COL2, . . . , COLn, respectively. Each of the plurality of multiplexers 320-1, 320-2, . . . , 320-n may receive the first and second analog signals AS1 and AS2 through the plurality of column lines COL1, COL2, . . . , COLn, respectively. Each of the plurality of multiplexers 320-1, 320-2, . . . , 320-n may be coupled to the output of the switching circuit 310. Each of the plurality of multiplexers 320-1, 320-2, . . . , 320-n may output a signal received through the corresponding column line COLk as the integration when the offset control signal OOS is deactivated, and output a signal received from the switching circuit 310 as the integration when the offset control signal OOS is activated. That is, when the offset control signal OOS is deactivated, each of the plurality of multiplexers 320-1, 320-2, . . . , 320-n may output the first and second analog signals AS1 and AS2, and, when the offset control signal OOS is activated, each of the plurality of multiplexers 320-1, 320-2, . . . , 320-n may output the first and second offset cancellations signals OCS1 and OCS2.

As illustrated in FIG. 7, while the controller 700 activates the offset control signal OOS, the controller 700 may activate the first phase signal PS1 during a time period in which the pixel array 100 outputs the first analog signal AS1, and activate the second phase signal PS2 during a time period in which the pixel array 100 outputs the second analog signal AS2.

Therefore, when the offset control signal OOS is activated and the first analog signal AS1 is provided through the corresponding column line COLk, each of the plurality of multiplexers 320-1, 320-2, . . . , 320-n may output the first offset cancellation signal OCS1 as the integration signal. When the offset control signal OOS is activated and the second analog signal AS2 is provided through the corresponding column line COLk, each of the plurality of multiplexers 320-1, 320-2, . . . , 320-n may output the second offset cancellation signal OCS2 as the integration signal. When the offset control signal OOS is deactivated, each of the plurality of multiplexers 320-1, 320-2, . . . , 320-n may output the first analog signal AS1 and the second analog signal AS2, which are received through the corresponding column line COLk, as the integration signal.

In some example embodiments, as illustrated in FIG. 7, the controller 700 may deactivate the offset control signal OOS after the offset cancellation circuit 300 outputs each of the first offset cancellation signal OCS1 and the second offset cancellation signal OCS2 one time.

Referring to FIG. 1, the correlated double sampling and integration circuit 400 may generate the accumulation signal ACCS by accumulatively performing the correlated double sampling operation and the integration operation on the integration signal received from the offset cancellation circuit 300 based on a reference voltage VREF, a third switch signal SWS3, a fourth switch signal SWS4, and a reset signal RSTS provided by the controller 700.

Figure 8:
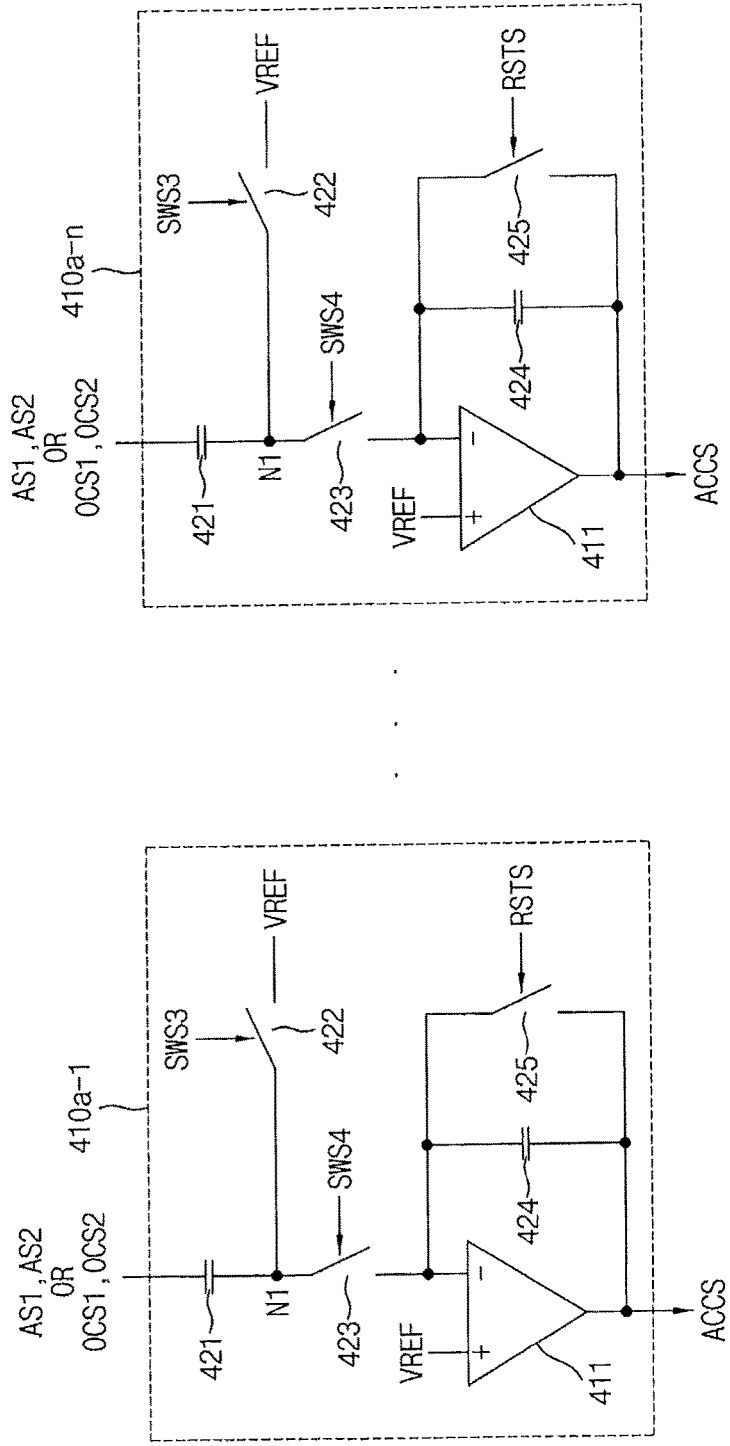
FIG. 8 is a circuit diagram illustrating a correlated double sampling and integration circuit included in the fingerprint sensor of FIG. 1 according to some example embodiments.

FIG. 8 is a circuit diagram illustrating a correlated double sampling and integration circuit 400a included in the fingerprint sensor 10 of FIG. 1 according to some example embodiments.

Referring to FIG. 8, the correlated double sampling and integration circuit 400a may include a plurality of integrators 410a-1, . . . , 410a-n corresponding to the plurality of multiplexers 320-1, 320-2, . . . , 320-n, respectively. The plurality of integrators 410a-1, . . . , 410a-n may receive the first and second analog signals AS1 and AS2 or the first and second offset cancellation signals OCS1 and OCS2 from the plurality of multiplexers 320-1, 320-2, . . . , 320-n, respectively, and the third switch signal SWS3, the fourth switch signal SWS4, the reference voltage VREF and the reset signal RSTS from the controller 700.

Each of the plurality of integrators 410a-1, . . . , 410a-n may include an amplifier 411, a storage capacitor 421, a first integration switch 422, a second integration switch 423, an accumulation capacitor 424, and a reset switch 425.

The amplifier 411 may include a negative input electrode (−), a positive input electrode (+), and an output electrode. The positive input electrode (+) of the amplifier 411 may receive the reference voltage VREF provided by the controller 700.

The storage capacitor 421 may be coupled between a first node N1 and the corresponding multiplexer 320-k. Thus, the storage capacitor 421 of the integrator 410a-k receives the first and second analog signals AS1 and AS2 or the first and second offset cancellation signals OCS1 and OCS2.

The first integration switch 422 may be turned on in response to the third switch signal SWS3 provided by the controller 700. When the first integration switch 422 is turned on by the third switch signal SWS3, the first integration switch 422 may provide the reference voltage VREF to the first node N1.

The second integration switch 423 may be coupled between the first node N1 and the negative input electrode (−) of the amplifier 411. The second integration switch 423 may be turned on in response to the fourth switch signal SWS4 provided by the controller 700. When the second integration switch 423 is turned on by the fourth switch signal SWS4, the second integration switch 423 may provide the output of node N1 to the negative input electrode (−) of the amplifier 411.

In some example embodiments, the third switch signal SWS3 and the fourth switch signal SWS4 may be activated alternately without an overlap period.

The accumulation capacitor 424 may be coupled between the negative input electrode (−) of the amplifier 411 and the output electrode of the amplifier 411.

The reset switch 425 may be coupled between the negative input electrode (−) of the amplifier 411 and the output electrode of the amplifier 411. That is, the accumulation capacitor 424 and the reset switch 425 may be coupled in parallel between the negative input electrode (−) of the amplifier 411 and the output electrode of the amplifier 411. The reset switch 425 may be turned on in response to the reset signal RSTS provided by the controller 700. When the reset switch 425 is turned on by the reset signal RSTS, the accumulation capacitor 424 may be reset.

In some example embodiments, the first integration switch 422, the second integration switch 423, and the reset switch 425 may include, for example, a MOS (Metal Oxide Semiconductor) transistor.

An amplification gain of the integrator 410a-k of FIG. 8 may be represented as Cs/Ca. Cs represents a capacitance of the storage capacitor 421, and Ca represents a capacitance of the accumulation capacitor 424.

Figure 9:
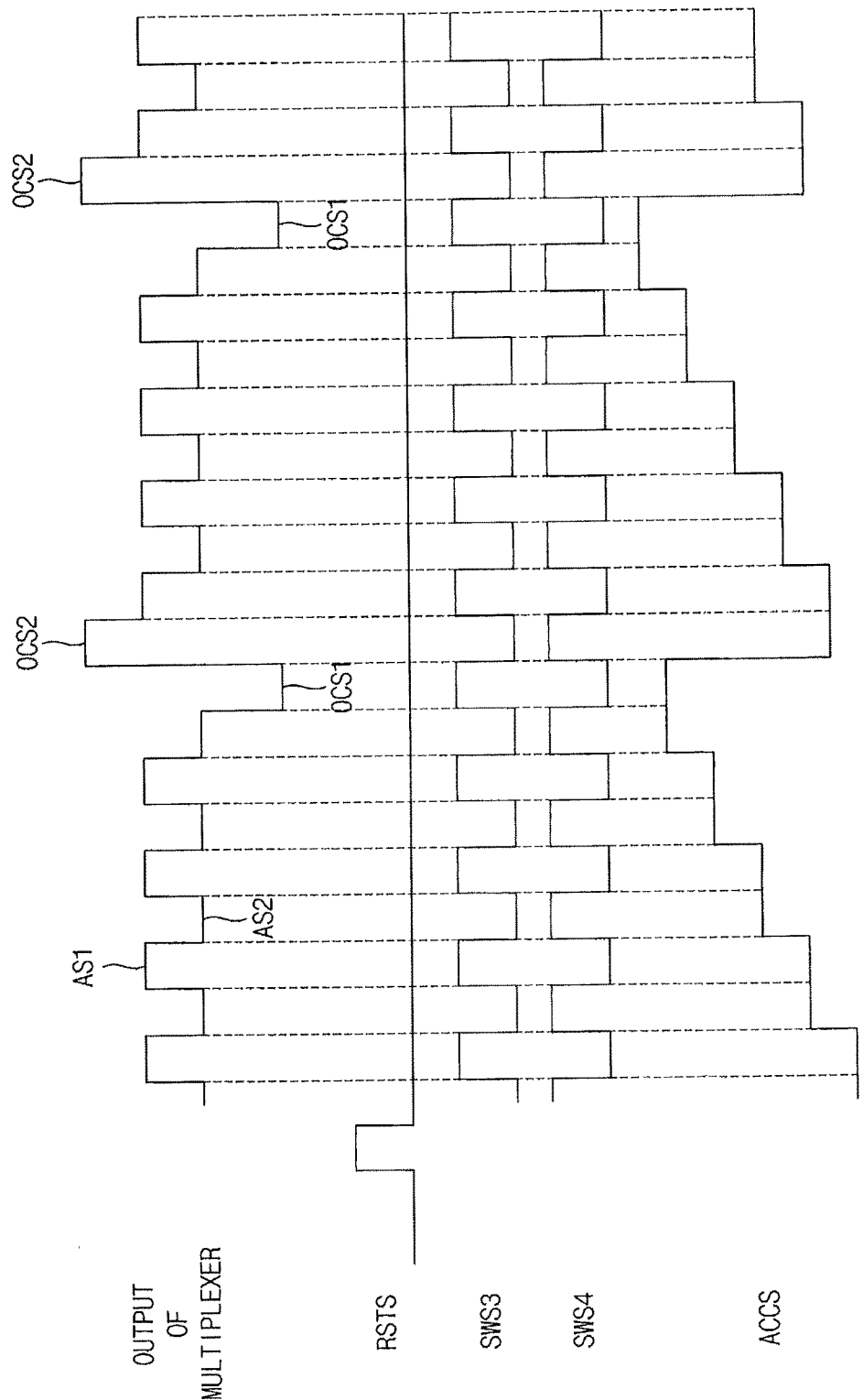
FIG. 9 is a timing diagram illustrating an operation of an integrator included in the correlated double sampling and integration circuit of FIG. 8.

FIG. 9 is a timing diagram illustrating an operation of an integrator 410a-k included in the correlated double sampling and integration circuit 400 of FIG. 8.

Referring to FIGS. 8 and 9, when the controller 700 determines one of the rows included in the pixel array 100 as the selected row, the controller 700 may activate the reset signal RSTS to reset the plurality of integrators 410a-1, . . . , 410a-n.

After that the plurality of integrators 410a-1, . . . , 410a-n are reset, while the first analog signal AS1 is provided through the plurality of column lines COL1, COL2, . . . , COLn, the controller 700 may activate the third switch signal SWS3 and deactivate the fourth switch signal SWS4. In addition, while the second analog signal AS2 is provided through the plurality of column lines COL1, COL2, . . . , COLn, the controller 700 may deactivate the third switch signal SWS3 and activate the fourth switch signal SWS4.

Therefore, the integrator 410a-k may perform the correlated double sampling operation and the integration operation on the integration signal received from the corresponding multiplexer 320-k to generate the accumulation signal ACCS.

As described above, the first analog signal AS1 may have the first voltage level, the second analog signal AS2 may have the second voltage level lower than the first voltage level, the first offset cancellation signal OCS1 may have the third voltage level lower than the second voltage level, and the second offset cancellation signal OCS2 may have the fourth voltage level higher than the first voltage level, as illustrated in FIG. 9.

Therefore, as illustrated in FIG. 9, when the corresponding multiplexer 320-k outputs the first analog signal AS1 and the second analog signal AS2 as the integration signal, the magnitude of the accumulation signal ACCS may increase as the integrator 410a-k accumulatively performs the correlated double sampling operation and the integration operation on the integration signal. When the corresponding multiplexer 320-k outputs the first offset cancellation signal OCS1 and the second offset cancellation signal OCS2 as the integration signal, if the integrator 410a-k performs the correlated double sampling operation and the integration operation on the integration signal, the magnitude of the accumulation signal ACCS may decrease.

Since the amplification gain of the integrator 410a-k is (Cs/Ca), when the integrator 410a-k performs the correlated double sampling operation and the integration operation on the first offset cancellation signal OCS1 and the second offset cancellation signal OCS2, the magnitude of the accumulation signal ACCS may decrease (Cs/Ca) times a difference between a magnitude of the first offset cancellation signal OCS1 and a magnitude of the second offset cancellation signal OCS2.

In some example embodiments, the controller 700 may activate the offset control signal OOS periodically. In this example embodiment, each of the plurality of multiplexers 320-1, 320-2, . . . , 320-n may periodically output the first offset cancellation signal OCS1 and the second offset cancellation signal OCS2 instead of the first analog signal AS1 and the second analog signal AS2 as the integration signal. Therefore, each of the plurality of integrators 410a-1, . . . , 410a-n included in the correlated double sampling and integration circuit 400a may periodically eliminate an offset having a magnitude corresponding to (Cs/Ca) times the difference between the magnitude of the first offset cancellation signal OCS1 and the magnitude of the second offset cancellation signal OCS2 from the accumulation signal ACCS. That is, the offset is eliminated from the accumulation signal ACCS when the plurality of multiplexers 320-1, 320-2, . . . , 320-n output the first and second offset cancellation signals OCS1 and OCS2.

Therefore, the number of times the correlated double sampling operation and the integration operation may be performed by the correlated double sampling and integration circuit 400a prior to the magnitude of the accumulation signal ACCS reaching the maximum value MAX may be effectively increased without increasing the size of the correlated double sampling and integration circuit 400a.

In some example embodiments, the controller 700 may activate the offset control signal OOS when the magnitude of the accumulation signal ACCS, which is generated by the correlated double sampling and integration circuit 400a, is greater than a threshold value. The threshold value may be predetermined.

Figure 10:
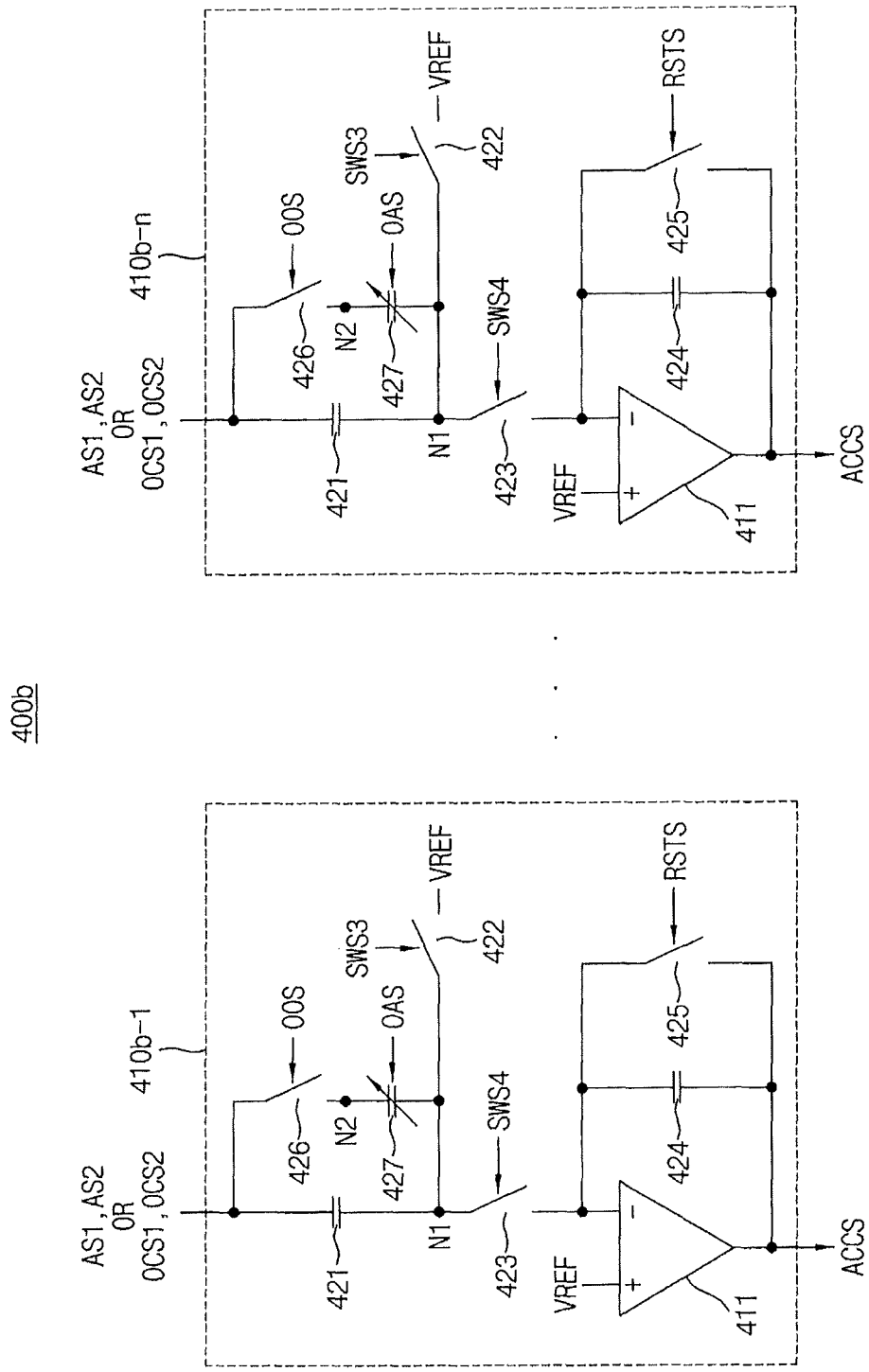
FIG. 10 is a circuit diagram illustrating a correlated double sampling and integration circuit included in the fingerprint sensor of FIG. 1 according to some example embodiments.

FIG. 10 is a circuit diagram illustrating a correlated double sampling and integration circuit 400b included in the fingerprint sensor 10 of FIG. 1 according to some example embodiments.

Referring to FIG. 10, the correlated double sampling and integration circuit 400b may include a plurality of integrators 410b-1, . . . , 410b-n corresponding to the plurality of multiplexers 320-1, 320-2, . . . , 320-n, respectively. The plurality of integrators 410b-1, . . . , 410b-n may receive the first and second analog signals AS1 and AS2 or the first and second offset cancellation signals OCS1 and OCS2 from the plurality of multiplexers 320-1, 320-2, . . . , 320-n, respectively, and the offset control signal OOS, an offset adjustment signal OAS, the third switch signal SWS3, the fourth switch signal SWS4, the reference voltage VREF, and the reset signal RSTS from the controller 700.

The integrator 410b-k included in the correlated double sampling and integration circuit 400b of FIG. 10 is the same as the integrator 410a-k included in the correlated double sampling and integration circuit 400a of FIG. 8, except that the integrator 410b-k further includes an offset adjustment switch 426 and an offset adjustment capacitor 427.

The offset adjustment switch 426 may be coupled between a second node N2 and the corresponding multiplexer 320-k. The offset adjustment switch 426 may be turned on in response to the offset control signal OOS. When the offset adjustment switch 426 is turned on by the offset control signal OOS, the offset adjustment switch 426 may provide the first and second offset cancellation signals OCS1 and OCS2 to the second node N.

The offset adjustment capacitor 427 may be coupled between the second node N2 and the first node N1. That is, the offset adjustment switch 426 and the offset adjustment capacitor 427 and the storage capacitor 421 may be coupled in parallel between the corresponding multiplexer 320-k and the first node N1.

Since the corresponding multiplexer 320-k outputs the first offset cancellation signal OCS1 and the second offset cancellation signal OCS2 as the integration signal when the offset control signal OOS is activated, the offset adjustment switch 426 may be turned on while the integrator 410b-k performs the correlated double sampling operation and the integration operation on the first offset cancellation signal OCS1 and the second offset cancellation signal OCS2. As a result, the offset adjustment capacitor 427 may be coupled to the storage capacitor 421 in parallel to increase an effective capacitance of the storage capacitor 421.

Therefore, when the integrator 410b-k performs the correlated double sampling operation and the integration operation on the first offset cancellation signal OCS1 and the second offset cancellation signal OCS2, an amplification gain of the integrator 410b-k may be increased to ((Cs+Co)/Ca). Co represents a capacitance of the offset adjustment capacitor 427.

Therefore, a magnitude of an offset eliminated from the accumulation signal ACCS when the integrator 410b-k included in the correlated double sampling and integration circuit 400b of FIG. 10 performs the correlated double sampling operation and the integration operation on the first offset cancellation signal OCS1 and the second offset cancellation signal OCS2, may be greater than the magnitude of the offset eliminated from the accumulation signal ACCS when the integrator 410a-k included in the correlated double sampling and integration circuit 400a of FIG. 8 performs the correlated double sampling operation and the integration operation on the first offset cancellation signal OCS1 and the second offset cancellation signal OCS2.

In some example embodiments, a capacitance of the offset adjustment capacitor 427 may be varied based on an offset adjustment signal OAS provided by the controller 700. In such an embodiment, the controller 700 may adjust the magnitude of the offset eliminated from the accumulation signal ACCS when the integrator 410b-k performs the correlated double sampling operation and the integration operation on the first offset cancellation signal OCS1 and the second offset cancellation signal OCS2, by controlling a magnitude of the offset adjustment signal OAS.

Figure 11:
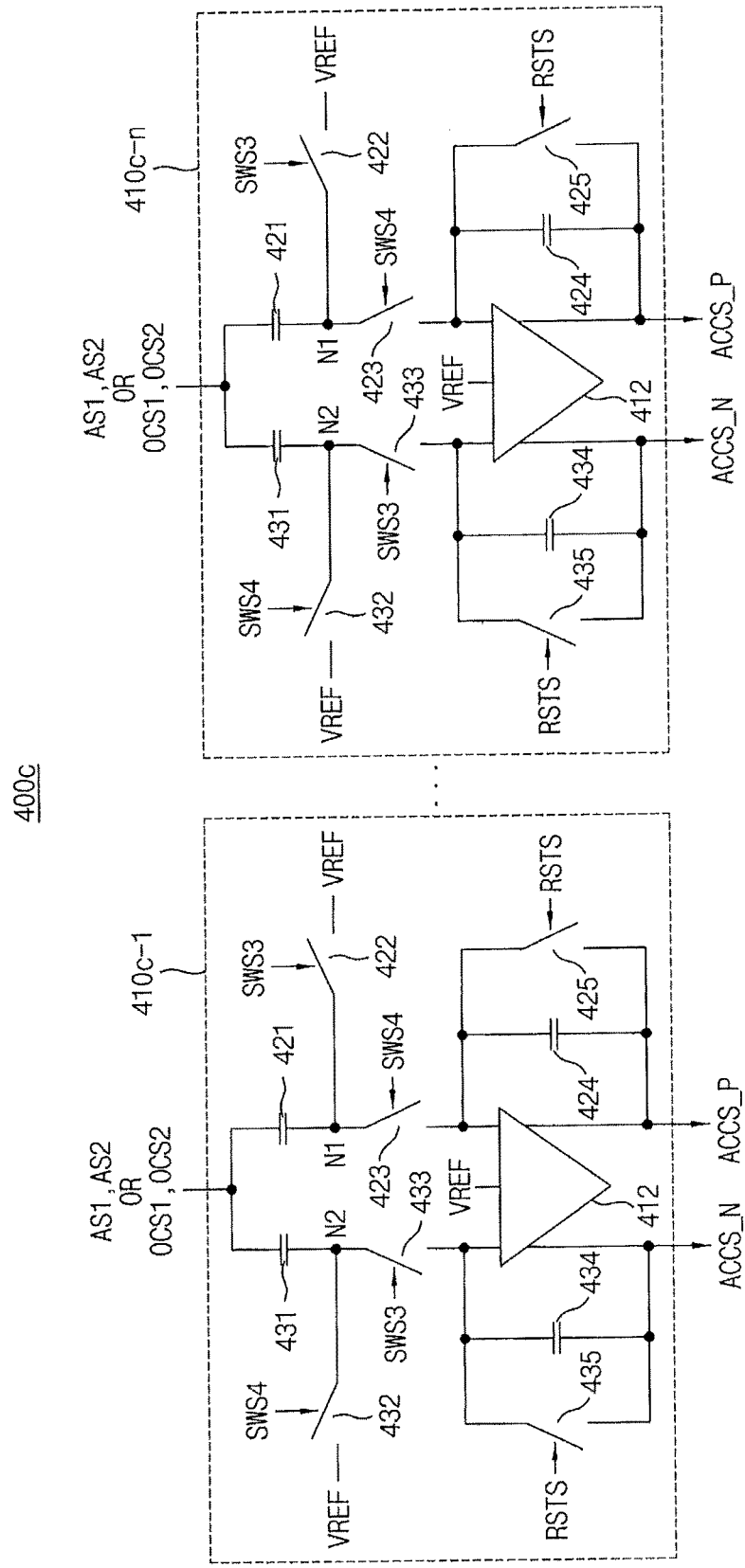
FIG. 11 is a circuit diagram illustrating a correlated double sampling and integration circuit included in the fingerprint sensor of FIG. 1 according to some example embodiments.

FIG. 11 is a circuit diagram illustrating a correlated double sampling and integration circuit 400c included in the fingerprint sensor 10 of FIG. 1 according to some example embodiments.

Referring to FIG. 11, a correlated double sampling and integration circuit 400c may include a plurality of integrators 410c-1, . . . , 410c-n corresponding to the plurality of multiplexers 320-1, 320-2, . . . , 320-n, respectively. The plurality of integrators 410c-1, . . . , 410c-n may receive the first and second analog signals AS1 and AS2 from the plurality of multiplexers 320-1, 320-2, . . . , 320-n, respectively, and the third switch signal SWS3, the fourth switch signal SWS4, the reference voltage VREF, and the reset signal RSTS from the controller 700.

Each of the plurality of integrators 410c-1, . . . , 410c-n may include an amplifier 412, a first storage capacitor 421, a first integration switch 422, a second integration switch 423, a first accumulation capacitor 424, a first reset switch 425, a second storage capacitor 431, a third integration switch 432, a fourth integration switch 433, a second accumulation capacitor 434, and a second reset switch 435.

The amplifier 412 may include a first input electrode, a second input electrode, a first output electrode, and a second output electrode, and operate based on the reference voltage VREF provided by the controller 700. The amplifier 412 may output a first accumulation signal ACCS_P through the first output electrode, and output a second accumulation signal ACCS_N through the second output electrode.

The first storage capacitor 421 may be coupled between a first node N1 and the corresponding multiplexer 320-k.

The second storage capacitor 431 may be coupled between a second node N2 and the corresponding multiplexer 320-k.

A capacitance of the first storage capacitor 421 may be substantially the same as a capacitance of the second storage capacitor 431.

The first integration switch 422 may be coupled to the first node N1. The first integration switch 422 may be turned on in response to the third switch signal SWS3 provided by the controller 700. When the first integration switch 422 is turned on by the third switch signal SWS3, the first integration switch 422 may provide the reference voltage VREF to the first node N1.

The second integration switch 423 may be coupled between the first node N1 and the first input electrode of the amplifier 412. The second integration switch 423 may be turned on in response to the fourth switch signal SWS4 provided by the controller 700. When the second integration switch 423 is turned on by the fourth switch signal SWS4, the first node N1 is coupled to the first input electrode of the amplifier 412.

The third integration switch 432 may be coupled to the second node N2. The third integration switch 432 may be turned on in response to the fourth switch signal SWS4 provided by the controller 700. When the third integration switch 432 is turned on by the fourth switch SWS4, the third integration switch 432 may provide the reference voltage VREF to the second node N2.

The fourth integration switch 433 may be coupled between the second node N2 and the second input electrode of the amplifier 412. The fourth integration switch 433 may be turned on in response to the third switch signal SWS3 provided by the controller 700. When the fourth integration switch 433 is turned on by the third switch signal SWS3, the second node N2 is coupled to the second input electrode of the amplifier 412.

In some example embodiments, the third switch signal SWS3 and the fourth switch signal SWS4 may be activated alternately without an overlap period.

The first accumulation capacitor 424 may be coupled between the first input electrode of the amplifier 412 and the first output electrode of the amplifier 412.

The first reset switch 425 may be coupled between the first input electrode of the amplifier 412 and the first output electrode of the amplifier 412. That is, the first accumulation capacitor 424 and the first reset switch 425 may be coupled in parallel between the first input electrode of the amplifier 412 and the first output electrode of the amplifier 412. The first reset switch 425 may be turned on in response to the reset signal RSTS provided by the controller 700. When the first reset switch 425 is turned on by the reset signal RSTS, the first accumulation capacitor 424 may be reset.

The second accumulation capacitor 434 may be coupled between the second input electrode of the amplifier 412 and the second output electrode of the amplifier 412.

The second reset switch 435 may be coupled between the second input electrode of the amplifier 412 and the second output electrode of the amplifier 412. That is, the second accumulation capacitor 434 and the second reset switch 435 may be coupled in parallel between the second input electrode of the amplifier 412 and the second output electrode of the amplifier 412. The second reset switch 435 may be turned on in response to the reset signal RSTS provided by the controller 700. When the second reset switch 435 is turned on by the reset signal RSTS, the second accumulation capacitor 434 may be reset.

A capacitance of the first accumulation capacitor 424 may be substantially the same as a capacitance of the second accumulation capacitor 434.

In some example embodiments, the first integration switch 422, the second integration switch 423, the third integration switch 432, the fourth integration switch 433, the first reset switch 425, and the second reset switch 435 may include, for example, a MOS (Metal Oxide Semiconductor) transistor.

An amplification gain of the integrator 410c-k of FIG. 11 may be represented as Cs/Ca. Cs represents a capacitance of the first storage capacitor 421 and the second storage capacitor 431, and Ca represents a capacitance of the first accumulation capacitor 424 and the second accumulation capacitor 434.

Figure 12:
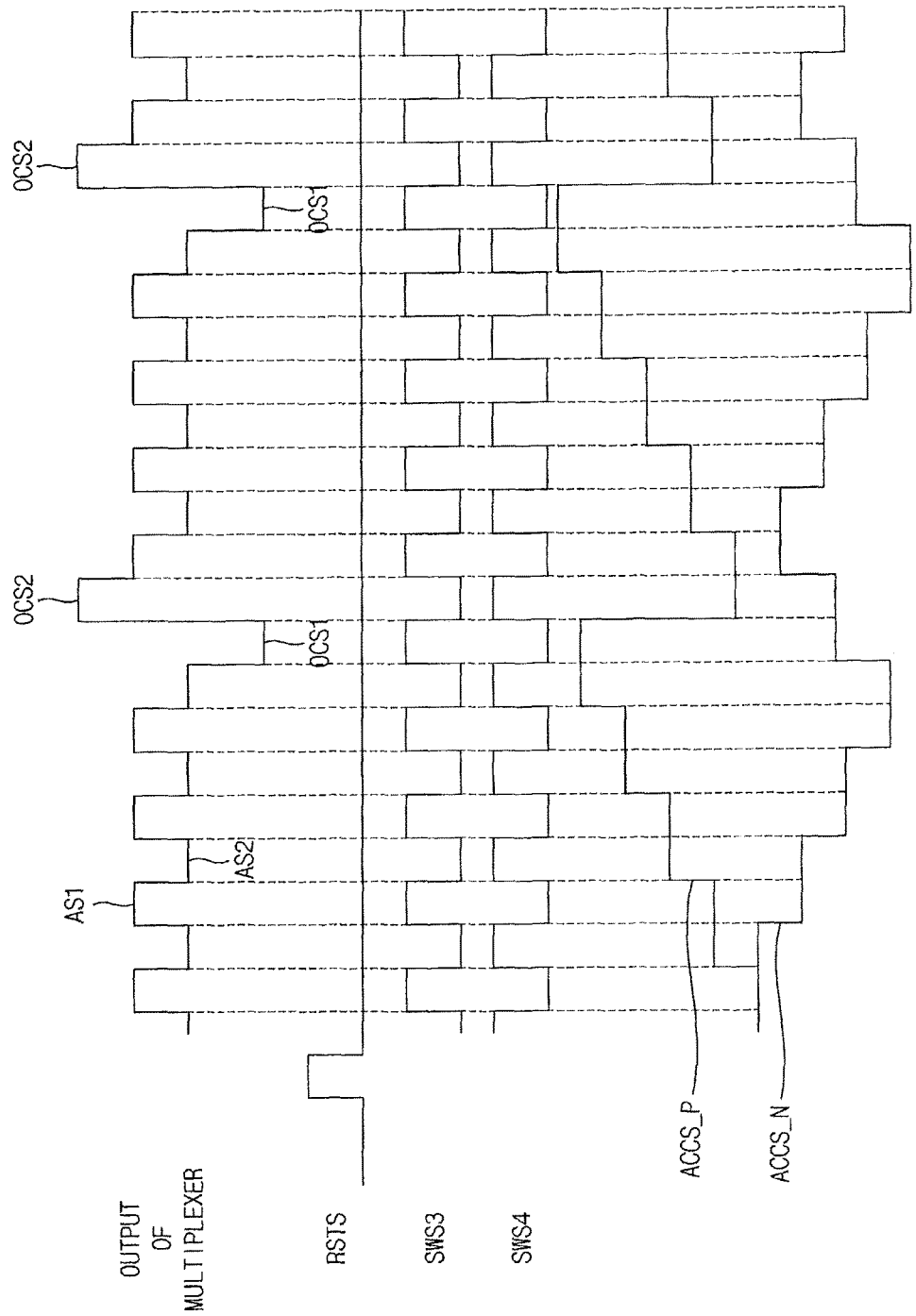
FIG. 12 is a timing diagram illustrating an operation of an integrator included in the correlated double sampling and integration circuit of FIG. 11.

FIG. 12 is a timing diagram illustrating an operation of an integrator 410c-k included in the correlated double sampling and integration circuit 400 of FIG. 11.

Referring to FIGS. 11 and 12, when the controller 700 determines that one of the rows included in the pixel array 100 is the selected row, the controller 700 may activate the reset signal RSTS to reset the plurality of integrators 410c-1, . . . , 410c-n.

After that, the controller 700 may activate the third switch signal SWS3 and deactivate the fourth switch signal SWS4 while the first analog signal AS1 is provided through the plurality of column lines COL1, COL2, . . . , COLn from the plurality of corresponding multiplexers 320-k. In addition, the controller 700 may deactivate the third switch signal SWS3 and activate the fourth switch signal SWS4 while the second analog signal AS2 is provided through the plurality of column lines COL1, COL2, . . . , COLn from the plurality of corresponding multiplexers 320-k.

Therefore, the integrator 410c-k may perform the correlated double sampling operation and the integration operation on the integration signal received from the corresponding multiplexer 320-k to generate the first accumulation signal ACCS_P and the second accumulation signal ACCS_N.

As described above, the first analog signal AS1 may have the first voltage level, the second analog signal AS2 may have the second voltage level lower than the first voltage level, the first offset cancellation signal OCS1 may have the third voltage level lower than the second voltage level, and the second offset cancellation signal OCS2 may have the fourth voltage level higher than the first voltage level, as illustrated in FIG. 12.

Therefore, as illustrated in FIG. 12, when the corresponding multiplexer 320-k outputs the first analog signal AS1 and the second analog signal AS2 as the integration signal, a magnitude of the first accumulation signal ACCS_P may increase and a magnitude of the second accumulation signal ACCS_N may decrease as the integrator 410c-k accumulatively performs the correlated double sampling operation and the integration operation on the integration signal. When the corresponding multiplexer 320-k outputs the first offset cancellation signal OCS1 and the second offset cancellation signal OCS2 as the integration signal, if the integrator 410c-k performs the correlated double sampling operation and the integration operation on the integration signal, the magnitude of the first accumulation signal ACCS_P may decrease and the magnitude of the second accumulation signal ACCS_N may increase.

In some example embodiments, the controller 700 may activate the offset control signal OOS periodically. In such an embodiment, each of the plurality of multiplexers 320-1, 320-2, . . . , 320-n may periodically output the first offset cancellation signal OCS1 and the second offset cancellation signal OCS2 instead of the first analog signal AS1 and the second analog signal AS2 as the integration signal. Therefore, each of the plurality of integrators 410c-1, . . . , 410c-n included in the correlated double sampling and integration circuit 400c may periodically eliminate an offset having a magnitude corresponding to (Cs/Ca) times the difference between the magnitude of the first offset cancellation signal OCS1 and the magnitude of the second offset cancellation signal OCS2 from the first accumulation signal ACCS_P and the second accumulation signal ACCS_N.

Therefore, the number of times the correlated double sampling operation and the integration operation may be performed by the correlated double sampling and integration circuit 400c prior to the magnitude of the first accumulation signal ACCS_P and the second accumulation signal ACCS_N reaching the maximum value MAX may be effectively increased without increasing the size of the correlated double sampling and integration circuit 400c.

In some example embodiments, the controller 700 may activate the offset control signal OOS when the magnitude of the first accumulation signal ACCS_P and the second accumulation signal ACCS_N generated by the correlated double sampling and integration circuit 400c is greater than a threshold value. The threshold value may be predetermined.

Figure 13:
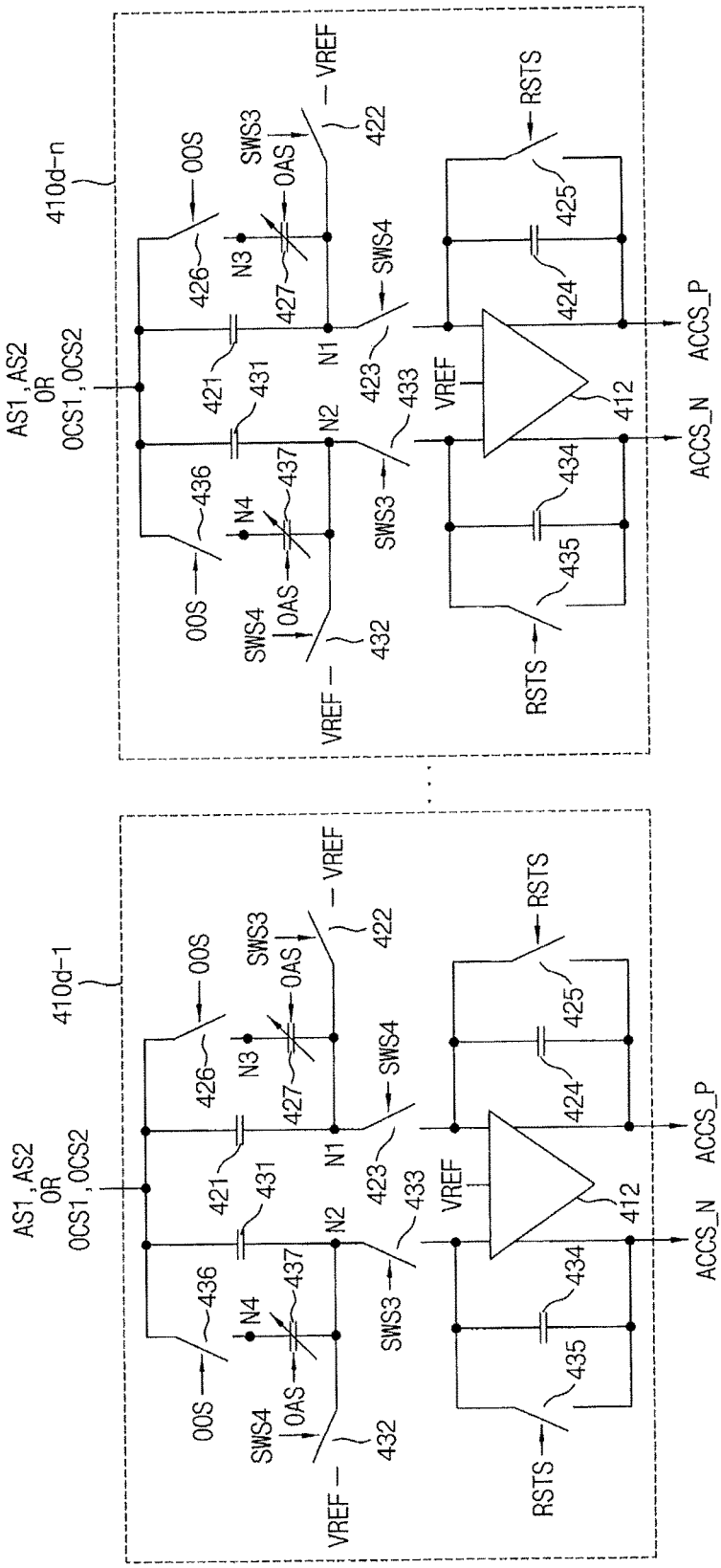
FIG. 13 is a circuit diagram illustrating a correlated double sampling and integration circuit included in the fingerprint sensor of FIG. 1 according to some example embodiments.

FIG. 13 is a circuit diagram illustrating a correlated double sampling and integration circuit 400d included in the fingerprint sensor 10 of FIG. 1 according to some example embodiments.

Referring to FIG. 13, a correlated double sampling and integration circuit 400d may include a plurality of integrators 410d-1, . . . , 410d-n corresponding to the plurality of multiplexers 320-1, 320-2, . . . , 320-n, respectively. The plurality of integrators 410d-1, . . . , 410d-n may receive the first and second analog signals AS1 and AS2 or the first and second offset cancellation signals OCS1 and OCS2 from the plurality of multiplexers 320-1, 320-2, . . . , 320-n, respectively, and the offset control signal OOS, the offset adjustment signal OAS, the first switch signal SWS3, the fourth switch signal SWS4, the reference voltage VREF and the reset signal RSTS from the controller 700.

The integrator 410d-k included in the correlated double sampling and integration circuit 400d of FIG. 13 is the same as the integrator 410c-k included in the correlated double sampling and integration circuit 400c of FIG. 11, except that the integrator 410d-k further includes a first offset adjustment switch 426, a first offset adjustment capacitor 427, a second offset adjustment switch 436, and a second offset adjustment capacitor 437.

The first offset adjustment switch 426 may be coupled between a third node N3 and the corresponding multiplexer 320-k. The first offset adjustment switch 426 may be turned on in response to the offset control signal OOS. When the first offset adjustment switch 426 is turned on by the offset control signal OOS, the first offset adjustment switch 426 may provide the first and second offset cancellation signals OCS1 and OCS2 to the third node N3.

The first offset adjustment capacitor 427 may be coupled between the third node N3 and the first node N1. That is, the first offset adjustment switch 426 and the first offset adjustment capacitor 427 and the storage capacitor 421 may be coupled in parallel between the corresponding multiplexer 320-k and the first node N1.

The second offset adjustment switch 436 may be coupled between a fourth node N4 and the corresponding multiplexer 320-k. The second offset adjustment switch 436 may be turned on in response to the offset control signal OOS. When the second offset adjustment switch 436 is turned on by the offset control signal OOS, the second offset adjustment switch 436 may provide the first and second offset cancellation signals OCS1 and OCS2 to the fourth node N3.

The second offset adjustment capacitor 437 may be coupled between the fourth node N4 and the second node N2. That is, the second offset adjustment switch 436 and the second offset adjustment capacitor 437 and the storage capacitor 431 may be coupled in parallel between the corresponding multiplexer 320-k and the second node N2

A capacitance of the first offset adjustment capacitor 427 may be substantially the same as a capacitance of the second offset adjustment capacitor 437.

Since the corresponding multiplexer 320-k outputs the first offset cancellation signal OCS1 and the second offset cancellation signal OCS2 as the integration signal when the offset control signal OOS is activated, the first offset adjustment switch 426 and the second offset adjustment switch 436 may be turned on while the integrator 410d-k performs the correlated double sampling operation and the integration operation on the first offset cancellation signal OCS1 and the second offset cancellation signal OCS2. As a result, the first offset adjustment capacitor 427 may be coupled to the first storage capacitor 421 in parallel and the second offset adjustment capacitor 437 may be coupled to the second storage capacitor 431 in parallel to increase an effective capacitance of the first storage capacitor 421 and the second storage capacitor 431, respectively.

Therefore, when the integrator 410d-k performs the correlated double sampling operation and the integration operation on the first offset cancellation signal OCS1 and the second offset cancellation signal OCS2, an amplification gain of the integrator 410d-k may be increased to $((Cs+Co)/Ca)$. Co represents a capacitance of the first offset adjustment capacitor 427 and the second offset adjustment capacitor 437.

Therefore, a magnitude of an offset eliminated from the first accumulation signal ACCS_P and the second accumulation signal ACCS_N when the integrator 410d-k included in the correlated double sampling and integration circuit 400d of FIG. 13 performs the correlated double sampling operation and the integration operation on the first offset cancellation signal OCS1 and the second offset cancellation signal OCS2, may be greater than the magnitude of the offset eliminated from the first accumulation signal ACCS_P and the second accumulation signal ACCS_N when the integrator 410c-k included in the correlated double sampling and integration circuit 400c of FIG. 11 performs the correlated double sampling operation and the integration operation on the first offset cancellation signal OCS1 and the second offset cancellation signal OCS2.

In some example embodiments, a capacitance of the first offset adjustment capacitor 427 and a capacitance of the second offset adjustment capacitor 437 may be varied based on an offset adjustment signal OAS provided by the controller 700. In such an embodiment, the controller 700 may adjust the magnitude of the offset eliminated from the first accumulation signal ACCS_P and the second accumulation signal ACCS_N when the integrator 410*d*-k performs the correlated double sampling operation and the integration operation on the first offset cancellation signal OCS1 and the second offset cancellation signal OCS2, by controlling a magnitude of the offset adjustment signal OAS.

Referring to FIG. 1, the sample and hold circuit 500 may sample the accumulation signal ACCS provided by the correlated double sampling and integration circuit 400 based on a hold signal HS provided by the controller 700, and output the sampled signal as a sampling signal SAMS.

The analog-to-digital converter 600 may perform an analog-to-digital conversion operation on the sampling signal SAMS provided by the sample and hold circuit 500 based on a first control signal CON1 provided by the controller 700 to generate a digital signal DS.

Therefore, the digital signal DS may represent the fingerprint pattern of the finger contacting the pixel array 100.

As described above with reference to FIGS. 1 to 13, in the fingerprint sensor 10 according to some example embodiments, the offset cancellation circuit 300 may output the first analog signal AS1 and the second analog signal AS2 received from the pixel array 100 as the integration signal, and output the first offset cancellation signal OCS1 and the second offset cancellation signal OCS2, instead of the first analog signal AS1 and the second analog signal AS2, as the integration signal periodically or when the magnitude of the accumulation signal ACCS generated by the correlated double sampling and integration circuit 400, is greater than a threshold value. Therefore, the correlated double sampling and integration circuit 400 may eliminate an offset from the accumulation signal ACCS periodically or when the magnitude of the accumulation signal ACCS generated by the correlated double sampling and integration circuit 400 is greater than the threshold value.

Therefore, the number of times the correlated double sampling operation and the integration operation may be performed by the correlated double sampling and integration circuit 400 prior to the magnitude of the accumulation signal ACCS reaching the maximum value MAX may be effectively increased without increasing the size of the correlated double sampling and integration circuit 400. As a result, a sensing performance of the fingerprint sensor 10 may be effectively increased.

In addition, since the correlated double sampling and integration circuit 400 generates the accumulation signal ACCS by performing the correlated double sampling operation and the integration operation on the integration signal an increased number of times, a thermal noise and/or a random noise occurring at the output electrode of the amplifier 224 included in each of the plurality of unit pixels 200 may be effectively reduced.

Figure 14:
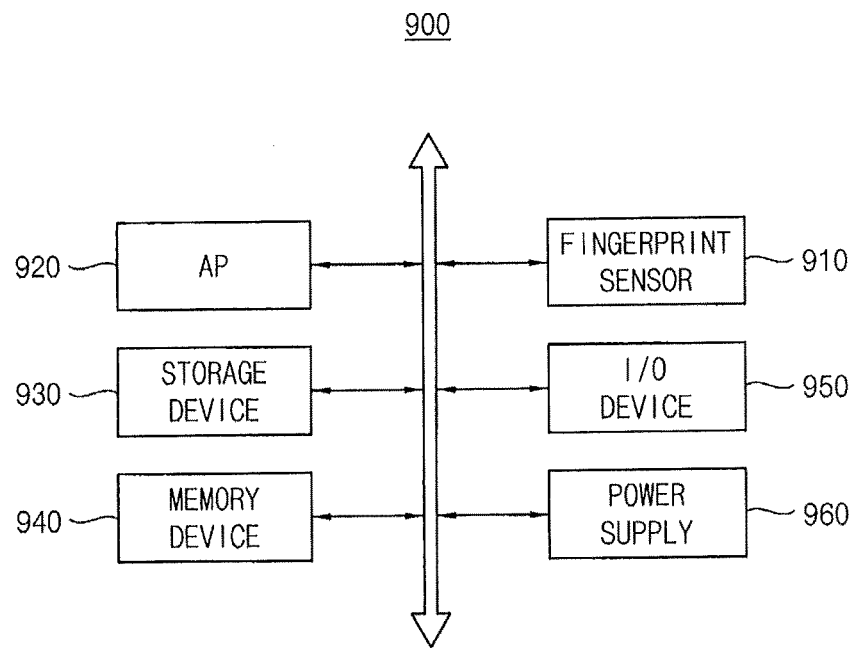
FIG. 14 is a block diagram illustrating an electronic device according to some example embodiments.

FIG. 14 is a block diagram illustrating an electronic device according to some example embodiments.

Referring to FIG. 14, an electronic device 900 includes a fingerprint sensor 910, an application processor AP 920, a storage device 930, a memory device 940, an input/output device 950, and a power supply 960 connected along a bus. Although it is not illustrated in FIG. 14, the electronic device 900 may further include ports that communicate with a video card, a sound card, a memory card, a universal serial bus (USB) device, other electronic devices or the like.

The fingerprint sensor 910 detects a fingerprint of a user and generates a digital signal representing the detected fingerprint. In some example embodiments, the fingerprint sensor 910 may generate an analog signal representing a fingerprint pattern of a user as an integration signal during a plurality of first time periods, and generate an offset cancellation signal having a predetermined voltage level as the integration signal during at least one second time period between the plurality of first time periods. The fingerprint sensor 910 may accumulatively perform a correlated double sampling operation and an integration operation on the integration signal during the plurality of first time periods and the at least one second time period to generate an accumulation signal, and generate the digital signal based on the accumulation signal.

The fingerprint sensor 910 may be the fingerprint sensor 10 of FIG. 1. A structure and an operation of the fingerprint sensor 10 are described above with reference to FIGS. 1 to 13. Therefore, a detailed description of the fingerprint sensor 910 will be omitted.

The application processor 920 controls overall operations of the electronic device 900. The application processor 920 may execute applications, such as a web browser, a game application, a video player, or the like. In some example embodiments, the application processor 920 may include a single core or multiple cores. For example, the application processor 920 may be a multi-core processor, such as a dual-core processor, a quad-core processor, a hexa-core processor, or the like. The application processor 920 may include an internal or external cache memory.

The storage device 930 may store a boot image for booting the electronic device 900. For example, the storage device 930 may include a nonvolatile memory device, such as a flash memory device, a solid state drive (SSD), or the like.

The memory device 940 may store data required for an operation of the electronic device 900. For example, the memory device 940 may include a volatile memory device, such as a dynamic random access memory (DRAM), a static random access memory (SRAM), or the like.

The input/output device 950 may include an input device, such as a touch screen, a keypad, or the like, and an output device such as a speaker, a display device, or the like. The power supply 960 may supply operational power to the electronic device 900.

In some example embodiments, the application processor 920 may authenticate the user based on the digital signal generated by the fingerprint sensor 910. For example, the storage device 930 may store digital data representing a fingerprint pattern of an allowed user of the electronic device 900. When the application processor 920 receives the digital signal representing a fingerprint pattern of a current user from the fingerprint sensor 910, the application processor 920 may compare the digital signal from the finger print sensor 910 with the digital data stored in the storage device 930 to determine whether the current user is the allowed user.

In some example embodiments, the electronic device 900 may be, for example, an arbitrary mobile device, such as a mobile phone, a smart phone, a personal digital assistant (PDA), a portable multimedia player (PMP), a digital camera, a camcorder, a music player, a portable game console, a navigation system, a laptop computer, or the like.

Figure 15:
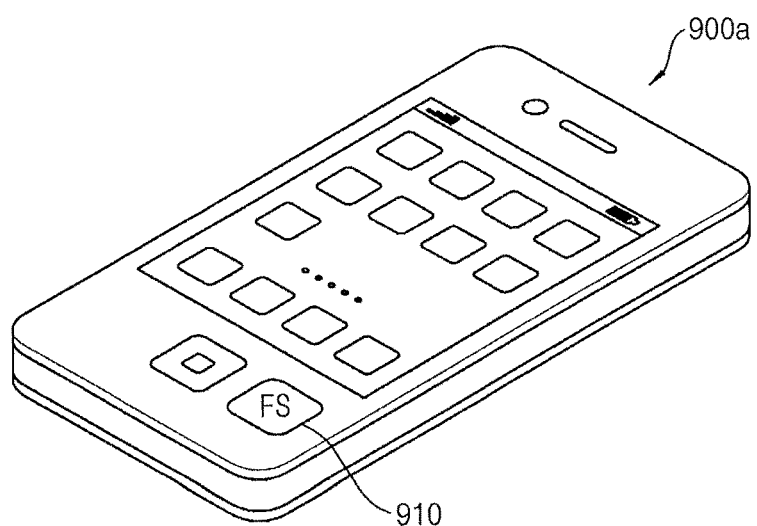
FIG. 15 is a diagram illustrating the electronic device of FIG. 14 being implemented as a smart phone according to some example embodiments.

FIG. 15 is a diagram illustrating the electronic device of FIG. 14 being implemented as a smart phone according to some example embodiments.

Referring to FIGS. 14 and 15, the fingerprint sensor FS 910 included in a smart phone 900a may generate a digital signal representing a fingerprint pattern of a current user by performing operations described above with reference to FIGS. 1 to 13. The smart phone 900a may include the elements of the electronic device 900 of FIG. 14.

The application processor 920 may determine whether the current user is an allowed user based on whether the digital signal received from the fingerprint sensor 910 is the same as the digital data stored in the storage device 930.

Although the fingerprint sensor 910 is located at a bottom part of a front face of the smart phone 900a in FIG. 15, example embodiments are not limited thereto. According to some example embodiments, the fingerprint sensor 910 may be located at any part of the smart phone 900a.

The foregoing is illustrative of the present inventive concepts and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A fingerprint sensor, comprising:
    a pixel array including a plurality of unit pixels arranged in rows and columns, each of the plurality of unit pixels configured to generate an analog signal by detecting a fingerprint of a user;
    an offset cancellation circuit configured to receive the analog signal from the plurality of unit pixels through a plurality of column lines, the offset cancellation circuit configured to output one of the analog signal and an offset cancellation signal as an integration signal based on an offset control signal;
    a correlated double sampling and integration circuit configured to accumulatively perform a correlated double sampling operation and an integration operation on the integration signal to generate an accumulation signal;
    a sample and hold circuit configured to sample the accumulation signal based on a hold signal to generate a sampling signal;
    an analog-to-digital converter configured to perform an analog-to-digital conversion operation on the sampling signal to generate a digital signal; and
    a controller configured to generate the offset control signal and the hold signal,
    wherein,
    when the offset control signal is deactivated, the offset cancellation circuit outputs the analog signal as the integration signal,
    when the offset control signal is activated, the offset cancellation circuit outputs the offset cancellation signal as the integration signal.

2. The fingerprint sensor of claim 1, wherein each of the plurality of unit pixels alternately outputs a first analog signal corresponding to a reset element, and a second analog signal corresponding to the fingerprint of the user a plurality of times through a corresponding column line among the plurality of column lines.

3. The fingerprint sensor of claim 2, wherein,
    when the offset control signal is deactivated, the offset cancellation circuit outputs the first analog signal and the second analog signal received through each of the plurality of column lines as the integration signal,
    when the offset control signal is activated and the first analog signal is provided through each of the plurality of column lines, the offset cancellation circuit outputs a first offset cancellation signal as the integration signal, and
    when the offset control signal is activated and the second analog signal is provided through each of the plurality of column lines, the offset cancellation circuit outputs a second offset cancellation signal as the integration signal.

4. The fingerprint sensor of claim 3, wherein the first analog signal has a first voltage level, the second analog signal has a second voltage level lower than the first voltage level, the first offset cancellation signal has a third voltage level lower than the second voltage level, and the second offset cancellation signal has a fourth voltage level higher than the first voltage level.

5. The fingerprint sensor of claim 3, wherein the controller activates the offset control signal periodically.

6. The fingerprint sensor of claim 3, wherein the controller activates the offset control signal when a magnitude of the accumulation signal generated by the correlated double sampling and integration circuit is greater than a threshold value.

7. The fingerprint sensor of claim 2, wherein the offset cancellation circuit includes:
    a switching circuit configured to receive a first phase signal and a second phase signal from the controller, the switching circuit configured to output a first offset cancellation signal when the first phase signal is activated, and to output a second offset cancellation signal when the second phase signal is activated; and
    a plurality of multiplexers corresponding to the plurality of column lines, respectively, each of the plurality of multiplexers configured to output the first analog signal and the second analog signal received through the corresponding column line as the integration signal when the offset control signal is deactivated, and to output an output signal of the switching circuit as the integration signal when the offset control signal is activated.

8. The fingerprint sensor of claim 7, wherein the correlated double sampling and integration circuit includes a plurality of integrators corresponding to the plurality of multiplexers, respectively, each of the plurality of integrators including:
    a storage capacitor coupled between a first node and a corresponding multiplexer among the plurality of multiplexers;
    a first integration switch configured to turn on in response to a first switch signal to provide a reference voltage to the first node;
    an amplifier including a negative input electrode, a positive input electrode receiving the reference voltage, and an output electrode;
    a second integration switch coupled between the first node and the negative input electrode of the amplifier, the second integration switch configured to turn on in response to a second switch signal;

an accumulation capacitor coupled between the negative input electrode of the amplifier and the output electrode of the amplifier; and a reset switch coupled between the negative input electrode of the amplifier and the output electrode of the amplifier, the reset switch configured to turn on in response to a reset signal.

9. The fingerprint sensor of claim 8, wherein the first switch signal and the second switch signal are activated alternately without an overlap period.

10. The fingerprint sensor of claim 8, wherein each of the plurality of integrators further includes:

an offset adjustment switch coupled between a second node and the corresponding multiplexer, the offset adjustment switch being configured to turn on in response to the offset control signal; and an offset adjustment capacitor coupled between the second node and the first node.

11. The fingerprint sensor of claim 10, wherein a capacitance of the offset adjustment capacitor is varied based on an offset adjustment signal provided by the controller.

12. The fingerprint sensor of claim 7, wherein the correlated double sampling and integration circuit includes a plurality of integrators corresponding to the plurality of multiplexers, respectively, each of the plurality of integrators including:

a first storage capacitor coupled between a first node and a corresponding multiplexer among the plurality of multiplexers;

a second storage capacitor coupled between a second node and the corresponding multiplexer;

an amplifier including a first input electrode, a second input electrode, a first output electrode, and a second output electrode, the amplifier being configured to operate based on a reference voltage;

a first integration switch configured to turn on in response to a first switch signal to provide the reference voltage to the first node;

a second integration switch coupled between the first node and the first input electrode of the amplifier, the second integration switch configured to turn on in response to a second switch signal;

a third integration switch configured to turn on in response to the second switch signal to provide the reference voltage to the second node;

a fourth integration switch coupled between the second node and the second input electrode of the amplifier, the fourth integration switch configured to turn on in response to the first switch signal;

a first accumulation capacitor coupled between the first input electrode of the amplifier and the first output electrode of the amplifier;

a first reset switch coupled between the first input electrode of the amplifier and the first output electrode of the amplifier, the first reset switch configured to turn on in response to a reset signal;

a second accumulation capacitor coupled between the second input electrode of the amplifier and the second output electrode of the amplifier; and a second reset switch coupled between the second input electrode of the amplifier and the second output electrode of the amplifier, the second reset switch configured to turn on in response to the reset signal.

13. The fingerprint sensor of claim 12, wherein each of the plurality of integrators further includes:

a first offset adjustment switch coupled between a third node and the corresponding multiplexer, the first offset adjustment switch configured to turn on in response to the offset control signal;

a first offset adjustment capacitor coupled between the third node and the first node;

a second offset adjustment switch coupled between a fourth node and the corresponding multiplexer, the second offset adjustment switch configured to turn on in response to the offset control signal; and a second offset adjustment capacitor coupled between the fourth node and the second node.

14. An electronic device, comprising:

a fingerprint sensor configured to generate an analog signal representing a fingerprint pattern of a user as an integration signal during a plurality of first time periods, to generate an offset cancellation signal having a first voltage level as the integration signal during at least one second time period between the plurality of first time periods to accumulatively perform a correlated double sampling operation and an integration operation on the integration signal during the plurality of first time periods and the at least one second time period to generate an accumulation signal, and to generate a digital signal based on the accumulation signal; and an application processor configured to authenticate the user based on the digital signal.

15. The electronic device of claim 14, wherein the fingerprint sensor includes:

a pixel array including a plurality of unit pixels arranged in rows and columns, each of the plurality of unit pixels configured to generate the analog signal by detecting a fingerprint of the user;

an offset cancellation circuit configured to receive the analog signal from the plurality of unit pixels through a plurality of column lines, the offset cancellation circuit configured to output one of the analog signal and the offset cancellation signal as the integration signal based on an offset control signal;

a correlated double sampling and integration circuit configured to accumulatively perform a correlated double sampling operation and an integration operation on the integration signal to generate the accumulation signal;

a sample and hold circuit configured to sample the accumulation signal based on a hold signal to generate a sampling signal;

an analog-to-digital converter configured to perform an analog-to-digital conversion operation on the sampling signal to generate the digital signal; and a controller configured to generate the offset control signal and the hold signal.

16. A fingerprint sensor, comprising:

a pixel array including a plurality of unit pixels arranged in rows and columns, each of the plurality of unit pixels configured to generate an analog signal by detecting a fingerprint of a user;

an offset cancellation circuit coupled to the pixel array and configured to receive the analog signal from the plurality of unit pixels of a selected row of the pixel array through a plurality of column lines, the offset cancellation circuit configured to output one of the analog signal and an offset cancellation signal as an integration signal based on an offset control signal; and a correlated double sampling and integration circuit coupled to the offset cancellation circuit and configured to accumulatively perform a correlated double sampling operation and an integration operation on the integration signal to generate an accumulation signal, the correlated double sampling and integration circuit configured to eliminate an offset element of the accumulation signal when the offset cancellation signal is output as the integration signal, wherein, when the offset control signal is deactivated, the offset cancellation circuit outputs the analog signal as the integration signal, when the offset control signal is activated, the offset cancellation circuit outputs the offset cancellation signal as the integration signal.

17. The finger-print sensor of claim 16, further comprising:
    a sample and hold circuit configured to sample the accumulation signal based on a hold signal to generate a sampling signal;
    an analog-to-digital converter configured to perform an analog-to-digital conversion operation on the sampling signal to generate a digital signal; and
    a controller configured to generate the offset control signal and the hold signal.

18. The fingerprint sensor of claim 16, wherein each of the plurality of unit pixels alternately outputs a first analog signal corresponding to a reset element, and a second analog signal corresponding to the fingerprint of the user a plurality of times through a corresponding column line among the plurality of column lines.

19. The fingerprint sensor of claim 18, wherein,
    when the offset control signal is deactivated, the offset cancellation circuit outputs the first analog signal and the second analog signal received through each of the plurality of column lines as the integration signal,
    when the offset control signal is activated and the first analog signal is provided through each of the plurality of column lines, the offset cancellation circuit outputs a first offset cancellation signal as the integration signal, and
    when the offset control signal is activated and the second analog signal is provided through each of the plurality of column lines, the offset cancellation circuit outputs a second offset cancellation signal as the integration signal.

20. The fingerprint sensor of claim 19, wherein the controller activates the offset control signal periodically.

* * * * *